United States Patent [19]
Mori et al.

[11] Patent Number: 5,404,369
[45] Date of Patent: Apr. 4, 1995

[54] SURFACE EMISSION TYPE SEMICONDUCTOR LASER

[75] Inventors: Katsumi Mori; Tatsuya Asaka; Hideaki Iwano; Takayuki Kondo, all of Suwa, Japan

[73] Assignee: Seiko Epson Corporation, Tokyo, Japan

[21] Appl. No.: 228,491

[22] Filed: Apr. 15, 1994

Related U.S. Application Data

[63] Continuation-in-part of Ser. No. 997,177, Dec. 28, 1992, Pat. No. 5,317,584, which is a continuation-in-part of Ser. No. 756,981, Sep. 9, 1991, Pat. No. 5,182,757, which is a continuation-in-part of Ser. No. 756,979, Sep. 9, 1991, Pat. No. 5,181,219, which is a continuation-in-part of Ser. No. 756,980, Sep. 9, 1991, Pat. No. 5,181,221.

[30] Foreign Application Priority Data

Sep. 12, 1990 [JP] Japan ................. 2-242000

[51] Int. Cl.$^6$ .............................................. H01S 3/19
[52] U.S. Cl. ........................................ 372/45; 372/46; 372/50; 372/92
[58] Field of Search ................. 372/45, 46, 50, 92

[56] References Cited

U.S. PATENT DOCUMENTS

| | | | |
|---|---|---|---|
| 4,637,122 | 1/1987 | Carney et al. | 29/569 L |
| 4,856,013 | 8/1989 | Iwano et al. | 372/45 |
| 4,949,351 | 8/1990 | Imanaka | 372/45 |
| 5,031,187 | 7/1991 | Orenstein et al. | 372/50 |

(List continued on next page.)

FOREIGN PATENT DOCUMENTS 2606223 10/1987 France.
61-079280 4/1986 Japan.

(List continued on next page.)

OTHER PUBLICATIONS

H-J Yoo et al., "Phase-Locked Two-Dimensional Array of Vertical Cavity Surface Emitting Lasers" Extended Abstracts 22th Conf. Solid State Devices and Materials (1990) Tokyo, Japan, pp. 521–524 (No month).

A. Ibaraki et al., "GaAs/GaAlAs DBR Surface Emitting Laser with GaAlAs/AlAs and $SiO_2/Ti_2$ Reflectors" 11th IEEE International Semiconductor Laser Conference, Aug. 29–Sep. 1, 1988.

"Surface-Emitting Laser Diode with Distributed Bragg Reflector and Buried Heterostructure" 8030 Electronics Letters, 4 Jan. 1990, vol. 26, No. 1, pp. 18–19.

A. Scherer et al. "Fabrication of Electrically Pumped Vertical Cavity Mircolasers" Lasers and Electro-Optics Society Annual Meeting Conference Proceedings, Oct. 17–20, 1989, Orlando, Florida.

J. L. Jewell et al. "Surface-emitting microlasers for photoic switching and interchip connections," Optical Engineering, Mar. 1990, vol. 29, No. 3, pp. 210–214.

Primary Examiner—James W. Davie
Attorney, Agent, or Firm—Oliff & Berridge

[57] ABSTRACT

A surface emission type semiconductor laser includes a plurality of semiconductor layers defining at least one resonator in a direction perpendicular to the semiconductor substrate of the laser, the layers including at least a cladding layer in the semiconductor layers being formed into at least one column-like portion extending in a direction perpendicular to the semiconductor substrate, and a II–VI group compound semiconductor epitaxial layer buried around the column-like portions. "Lattice mismatch ratio" between the II–VI group compound semiconductor epitaxial layer and the column-like portions is no more than 0.2%, or more preferably no more than 0.16%. The II–VI group compound semiconductor layer is formed from an adduct consisting of II group organometallic compound and VI group organometallic compound and a VI group hydride by the use of a chemical vapor deposition. If a plurality of column-like portions are to be formed by a separation groove, these column-like portions are separated from one another, the II–VI group compound semiconductor epitaxial layer being buried in the separation groove.

43 Claims, 21 Drawing Sheets

U.S. PATENT DOCUMENTS

| | | | |
|---|---|---|---|
| 5,045,500 | 9/1991 | Mitsui et al. | 437/129 |
| 5,045,897 | 9/1991 | Ahlgren | 357/17 |
| 5,052,016 | 9/1991 | Mahbobzadeh et al. | 372/96 |
| 5,059,552 | 10/1991 | Harder et al. | 437/129 |
| 5,068,868 | 11/1991 | Deppe et al. | 372/45 |
| 5,084,893 | 1/1992 | Sekii et al. | 372/46 |
| 5,086,430 | 2/1992 | Kapon et al. | 372/50 |
| 5,181,219 | 1/1993 | Mori et al. | 372/45 |
| 5,181,221 | 1/1993 | Mori et al. | 372/46 |
| 5,182,757 | 1/1993 | Mori et al. | 372/45 |
| 5,204,370 | 4/1993 | Faist et al. | 372/45 |
| 5,295,148 | 3/1994 | Mori et al. | 372/46 |

FOREIGN PATENT DOCUMENTS

| | | |
|---|---|---|
| 61-258489 | 11/1986 | Japan . |
| 1125990 | 5/1989 | Japan . |
| 1266779 | 10/1989 | Japan . |
| 4-363081 | 12/1992 | Japan . |

FIG.9a  FIG.9b  FIG.9c  FIG.9d  FIG.9e
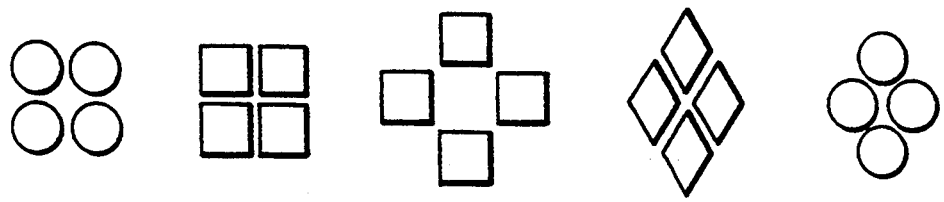
FIG.9f  FIG.9g  FIG.9h  FIG.9i  FIG.9j
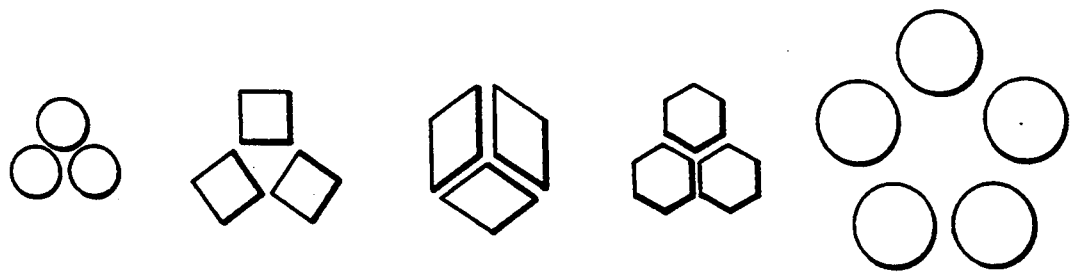
FIG.9k  FIG.9ℓ  FIG.9m
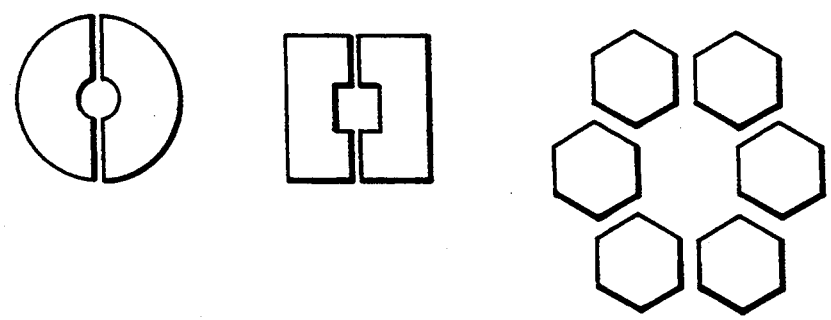

SURFACE EMISSION TYPE SEMICONDUCTOR LASER

This application is a continuation-in-part of application Ser. No. 07/997,177 filed on Dec. 28, 1992, U.S. Pat. No. 5,317,584, which is a continuation-in-part of application Ser. Nos. 07/756,981, U.S. Pat. No. 5,182,757, 07/756,979, U.S. Pat. No. 5,181,219, and 07/756,980, U.S. Pat. No. 5,181,221, filed on Sep. 9, 1991.

BACKGROUND OF THE INVENTION

1. Field of the Invention

The present invention relates to a surface emission type semiconductor laser adapted to emit a laser beam in a direction perpendicular to a substrate.

2. Description of the Related Art

A surface emission type laser including a resonator disposed in a direction perpendicular to the substrate thereof is disclosed in Lectures of the 50-th Meeting of Applied Physics in Japan (Sep. 27, 1989), Vol. 3, pp. 909, 29a-ZO-7. In accordance with the prior art, as shown in FIG. 12, there is first provided an n-type GaAs substrate 602 on which an n-type AlGaAs/AlAs multi-layer film 603, an n-type AlGaAs cladding layer 604, a p-type GaAs active layer 605 and a p-type AlGaAs cladding layer 606 are sequentially grown and formed. The multi-layered structure is then etched while leaving a column-like part at the top thereof. The remaining column-like part is enclosed by a buried layer which is formed by sequentially growing a p-type layer 607, n-type layer 608, p-type layer 609 and p-type layer 610 all of which are of AlGaAs in liquid phase epitaxy method. Thereafter, a multi-layer dielectric film 611 is deposited on the cap layer of p-type AlGaAs 610 at the top thereof. Finally, p- and n-type ohmic electrodes 612 and 601 are formed respectively on the top and bottom end faces of the structure thus formed. In such a manner, a surface emission type semiconductor laser will be completed.

The buried layer (607–608) formed in the above manner defines a p-n junction which is used as means for preventing current from leaking to layer sections other than the active layer section.

However, by using such a p-n junction, it is difficult to provide a sufficient current restriction; and it cannot suppress any reactive current perfectly. Due to generation of heat in the component, therefore, the surface emission type semiconductor laser constructed in accordance with the prior art is impractical in that it is difficult to perform a continuous generating drive in room temperature. It is thus important to restrict the reactive current in the surface emission type semiconductor laser.

Where the buried layer is of a multi-layered structure to form a p-n junction as in the prior art, the p-n interface in the buried layer should be positioned in consideration of a position of the interface between each of the adjacent column-like grown layers. It is difficult to control the thickness of each layer in the multi-layered structure. It is therefore very difficult to consistently produce surface emission type semiconductor lasers.

If a buried layer is formed around the column by the liquid phase epitaxy method as in the prior art, there is a high risk of breaking-off of the column-like part, leading to a reduced yield. The prior art was thus subject to a structural limitation in improving its characteristics.

The prior art raises further problems even when it is applied to various other devices such as laser printers and the like.

For example, laser printers can have an increased freedom of design as in simplifying the optical system or in decreasing the optical path, since the source of light (semiconductor laser and so on) has a relatively large size of light spot equal to several tens $\mu$m and if a light emitting element having an increased intensity of light emission is used in the laser printers.

With the surface emission type semiconductor laser constructed according to the prior art, the optical resonator is entirely buried in a material having a refractive index higher than that of the resonator. Light rays are mainly guided in the vertical direction. As a result, a spot of light emission in the basic generation mode will have a diameter equal to about 2 $\mu$m even if the shape of the resonator is modified in the horizontal direction.

It has been proposed that the light spots be located close to each other up to about 2 $\mu$m and that a plurality of light sources be used to increase the size of a spot. From the standpoint of reproductiveness and yield, however, it is very difficult with the prior art to bury a plurality of resonators spaced away from one another by several microns to using the LPE method. Even if such a burying can be successfully carried out, the spots cannot be united into a single spot since the transverse leakage of light is little.

It is also necessary that a plurality of light spots are formed into a single beam of light and that the laser beams each consisted of plural spots are in phase to increase the intensity of light emission. However, the prior art could not produce a surface emission type semiconductor laser which emits a plurality of laser beams close to one another up to a distance by which one of the laser beams are influenced by the other in order to synchronize the laser beams in phase.

SUMMARY OF THE INVENTION

It is therefore an object of the present invention to provide a high-efficiency surface emission type semiconductor laser which is of a complete current restrictable structure provided by improving the material from which the buried layer is made and which can be produced in a very simple manner.

Another object of the present invention is to provide a surface emission type semiconductor laser which includes a plurality of light emitting portions located close to one another and which can synchronize laser beams from the light emitting portions in phase.

Still another object of the present invention is to provide a surface emission type semiconductor laser which can emit a single laser beam formed by the inphase laser beams from the light emitting portions, said single laser beam having a relatively large light spot and a reduced angle of radiation.

To this end, a surface emission type semiconductor laser for emitting a beam in a direction perpendicular to a semiconductor substrate in which said laser is formed comprising: an optical resonator including a pair of reflecting mirrors having different reflectivities and a plurality of semiconductor layers between said reflecting mirrors, said semiconductor layers including at least a cladding layer in said semiconductor layers being formed into at least one column-like portion; a II–VI group compound semiconductor epitaxial layer surrounding said at least one column-like portion; and a ratio of the difference between a lattice constant (A) of said column-like portion and a lattice constant (B) of said II–VI group compound semiconductor epitaxial layer with respect to the lattice constant (A) of said column-like portion (hereinafter, this ratio |B-A|/A will be referred to "lattice mismatch ratio") being equal to or less than 0.2% and preferably equal to or less than 0.16%.

If there is a dislocation or defect in the interface between the column-like portion and the II–VI group compound semiconductor epitaxial layer, it raises a problem in that electric current cannot effectively be transformed into light due to transformation of electric current into heat or due to absorption and/or scattering of light at the dislocated or defective part. The inventors fully studied such a problem and discovered that if the difference between the lattice constants of the column-like portion and II–VI group compound semiconductor epitaxial layer is set within a specific range, any dislocation or defect will not significantly been produced at the interface between these layers. This will be described below.

If the II–VI group compound has a lattice constant different from that of the column-like portion and when the film-thickness of the II–VI group compound layer is very small, the II–VI group compound layer (buried layer) can be epitaxially grown by distortion in the crystals in accordance with the lattice constant of the column-like portion. However, as the growth of the buried layer is continued to increase its film-thickness, the distortion of the crystals will be correspondingly increased until dislocations or defects are produced in the buried layer and/or in the interface between the semiconductor layers and the buried layer. Ultimately, the buried layer will have crystals having the lattice constant inherent in the II–VI group compound. When a crystal having different lattice constant from that of the semiconductor layers such as the column-like portion is to be grown, there exists a film-thickness of the crystal which causes a defect or dislocation sufficient to destroy the epitaxial structure to be produced. Such a film-thickness will be referred to "critical film-thickness".

FIG. 21 shows the relationship between the critical film-thickness and the lattice mismatch ratio when a II–VI group compound of ZnSSe is grown on a semiconductor substrate made of a III–V group compound of AlGaAs through a metalorganic chemical vapor deposition (MOCVD). Although several critical film-thickness measuring methods are known in the art, an X-ray diffraction method was used herein. The diffraction method utilizes the following principle. Since a lattice of a epitaxial crystal layer is distorted on growth if the crystal layer having a lattice constant different from that of a substrate is to be formed on that substrate and when the epitaxial crystal layer has its film-thickness smaller than the critical film-thickness, the lattice constant a⊥ in a direction perpendicular to the plane of the substrate will be larger or smaller than the inherent lattice constant. On the other hand, another crystal layer having its film-thickness equal to or larger than the critical film-thickness will have its inherent lattice constant a⊥ in the direction perpendicular to the plane of the substrate since the lattices return to their inherent crystalline state due to defects or dislocations. If the lattice constant a⊥ is measured while changing the film-thickness of the crystal layer, a film-thickness providing a lattice constant a⊥ inherent in the crystal layer, that is, a critical film-thickness can be determined.

As will be apparent from FIG. 21, the critical film-thickness is greatly reduced particularly at a region having its relatively small lattice mismatch ratio as the lattice mismatch ratio between the II–VI group compound epitaxial layer and the substrate is increasing. If the thickness of the buried layer in the surface emission type semiconductor laser was usually between 0.2 μm and 5 μm and more practically between 0.5 μm and 3 μm, it was confirmed that the lattice mismatch ratio between the buried layer and the column-like portion of the semiconductor layers may be equal to or smaller than 0.2% and preferably equal to or smaller than 0.16%.

It has been confirmed that an acceptable range of lattice mismatch ratio between the buried layer and the column-like portion of the semiconductor layers somewhat depends on the material forming the buried layer, but can be substantially within the aforementioned range.

An X-ray rocking curve was measured to study the crystalline state of $ZnS_xSe_{1-x}$ crystal layer relative to GaAs which is generally used to form the semiconductor layers of the resonator. The results of measurement are shown in FIG. 22 in which an ordinate axis represents full width at half maximum (FWHM) in the X-ray rocking curve, an lower abscissa axis represents percentage compositions x of $ZnS_xSe_{1-x}$ and an upper abscissa axis represents lattice mismatch ratios.

For this measurement, materials $ZnS_xSe_{1-x}$ having different percentage compositions x were formed on the respective substrates of GaAs all with a film-thickness of 2 μm through MOCVD to form five samples different in percentage composition from one another. The FWHM of the X-ray rocking curve was determined for each sample.

As will be apparent from FIG. 22, the lattice mismatch ratio is substantially equal to zero when the percentage composition x is 0.06. The FWHM of the X-ray rocking curve correspondingly becomes minimum to provide minimum dislocation or defect in the crystals. When the percentage composition x changes to shift from 0.06 in the forward or rearward direction, the lattice mismatch ratio as well as the FWHM of the X-ray rocking curve increase. As a result, it was also confirmed that the dislocation or defect correspondingly increased in the crystals. When a buried layer of ZnSSe is formed on a semiconductor layer of GaAs, $ZnS_{0.06}Se_{0.94}$ provides the minimum lattice mismatch ratio in connection with the semiconductor layers. Thus, the dislocation or defect is difficult to occur in the buried layer.

The present invention may provide some preferred combinations of the buried layer with the column-like portion of the semiconductor layers when the lattice mismatch ratio is equal to or lower than 0.2%, as shown in Table 1.

TABLE I

| Column-Like Portion | Buried Layer | Lattice Mismatch Ratio (%) |
|---|---|---|
| $Al_xGa_{1-x}As$ (x = 0–1) | $ZnS_ySe_{1-y}$ (y = 0.02–0.08) | 0–0.2 |
| $In_xGa_{1-x}P$ (x = 0.5) | $ZnS_ySe_{1-y}$ (y = 0–0.07) | 0–0.2 |
| $GaAs_xP_{1-x}$ (x = 0.5) | $ZnS_ySe_{1-y}$ (y = 0.41–0.49) | 0–0.2 |

Particularly, a combination of $Al_xGa_{1-x}$ As with $ZnS_{0.06}Se_{0.94}$ is preferable since it provides a lattice mismatch ratio ranging between 0.003 and 0.13.

It is desirable that the II–VI group compound semiconductor epitaxial layer is formed of an adduct (addition product) consisting of a II group organometallic compound and a VI group organometallic compound and a VI group hydride through MOCVD.

The adduct may be formed of at least one selected from the group consisting of alkyl zinc-alkyl selenium, alkyl zinc-alkyl sulfide, alkyl cadmium-alkyl selenium and alkyl cadmium-alkyl sulfide and the hydride may be formed of at least one selected from the group consisting of hydrogen selenide, hydrogen sulfide and hydrogen telluride. It is preferable that the alkyl is ethyl or methyl.

Since the II–VI group compound epitaxial layer has a high resistance, the buried layer formed by this high-resistance layer can prevent a leakage of incoming current thereinto. This can attain very effective current restriction. Furthermore, the threshold level of current can be decreased since the reactive current is reduced. As a result, the present invention can provide a surface emission type semiconductor laser which generates less heat and can continuously perform the generation in room temperature. Since the buried layer is not multi-layered, it can be easily formed with consistency. Furthermore, the II–VI group compound semiconductor epitaxial layer can be formed by MOCVD, resulting in improvement of the yield in forming the buried layer. If the metalorganic chemical vapor deposition is used, a buried layer can be reliably formed while permitting a plurality of column-like portions to be closer to one another, even if a space in which the buried layer is to be formed is small.

When the II–VI group compound semiconductor layer used as a buried layer is formed of an adduct consisting of II group organometallic compound and VI group organometallic compound and a VI group hydride, the buried layer can be formed at a temperature much lower than that of the prior art. The crystallinity in each of the layers defining the resonator can be thus prevented from being degraded by heat produced on forming the buried layer. At the same time, the buried layer can be provided with a superior crystallinity and a sufficient uniformity.

When the semiconductor layer is formed of II-group and VI-group materials using the MOCVD, the buried layer will be formed at a very high temperature (which is equal to or higher than 600° C.). Such a high temperature raises several problems in that the crystallization in the respective layers defining the resonator is degraded due to transition or defect, in that an interdiffusion of materials will be created at the interface between the layers defining the resonator and the buried layer, in that the buried layer itself will have its degraded crystallization with insufficient uniformity and so on.

If the conventional MOCVD process is used to perform the growth by the use of a simple dimethyl zinc substance, hydrogen sulfide and hydrogen selenium at low temperature, the dimetyl zinc will be undesirably decomposed so as to combine with selenium and sulfur prior to raching the substrate. This will preclude the epitaxial, growth sice there is a mass of ZnSSe deposited on the substrate.

However, these problems in the prior art can be overcome by using the aforementioned adduct and VI group hydride to lower the temperature in the MOCVD to a level equal to or lower than 500° C. and preferably 300° C.

It is preferred that the semiconductor layer defining the resonator is a III–V group compound semiconductor epitaxial layer of GaAs, GaAlAs, GaAsP, InGaP, InGaAsP, InGaAs, AlGaAsSb or the like.

If the thickness of the semiconductor contact layer on the exit side of the optical resonator is equal to or less than 3.0 μm, the light absorption can be reduced in the contact layer.

If the cross-section of the column-like portion parallel to the semiconductor substrate is circular or regular polygonal, it can provide a fairly circular spot beam. If the diameter or diagonal of the cross-section just mentioned is equal to or less than 10 μm, NFP (Near Field Pattern) mode be comes 0-order basic mode.

If the optical resonator has a single column-like portion the reflecting mirror on the exit side thereof may be formed at a position opposite to the end face of the column within the range of said end face. In this case the refractive index waveguide structure may be either of rib waveguide type or buried type.

In this surface emission type semiconductor laser, the optical resonator may include a separation groove or grooves for separating one of the column-like portions from another adjacent one. The II–VI group compound semiconductor epitaxial layer is buried in the separation groove and a light emitting portion is formed on each of the column-like portions. The separation groove should not reach the active layer in the semiconductor layers defining the optical resonator. In such a manner, the respective light emitting portions are influenced by each other through the active layer, such-that the lights from the light emitting portions will be in phase.

When it is desired to increase the light emission spot, a II–VI group compound semiconductor epitaxial layer which is transparent for the wavelength of the exit laser beam may be buried in the separation groove. The exit side reflecting mirror is formed through a region opposite to the end face of each of the column-like layers and the II–VI group compound semiconductor epitaxial layer buried in the separation groove. Thus, a region sandwiched between each adjacent light emitting portions also serves as a vertical resonating structure. Light leaked into such a region effectively contributes to the laser generation to increase the light emission spot in size. Since the synchronized laser beams are superimposed one over another, the light output increases and the angle of radiation decreases. With a GaAs laser generally used as a semiconductor layer of a resonator, the II–VI group compound semiconductor epitaxial layer transparent for the wavelength of the laser beam therefrom may be made of either ZnSe, ZnS, ZnSSe, ZnCdS or CdSSe. If the separation groove is perpendicular to the semiconductor substrate, light rays slantingly entering the separation groove can be totally reflected to increase the confinement of light, utilizing a differential refraction. If the cross-section of the separation groove parallel to the semiconductor substrate has a width ranging between 0.5 μm and 10 μm, the order of the transverse generation mode measured from NFP becomes 0-order basic mode.

The apparatus of the present invention may comprise a plurality of surface emission type lasers simultaneously formed in a single substrate, each of the surface emission type lasers including an oscillator which can be freely arranged in the two-dimensional plane.

BRIEF DESCRIPTION OF THE DRAWINGS

FIG. 8a shows the shape of the surface emission type semiconductor laser of the prior art on the exit side thereof; FIG. 8b shows an intensity profile in the near field pattern of the semiconductor laser shown in FIG. 8a; FIG. 8c shows the shape of the semiconductor laser of the present embodiment at the exit side; and FIG. 8d shows an intensity profile of the near field pattern of the semiconductor laser shown in FIG. 8c.

FIGS. 9a–9m schematically illustrate various shapes of surface emission type semiconductor lasers constructed according to further embodiments of the present invention at the exit sides thereof.

DETAILED DESCRIPTION OF THE PREFERRED EMBODIMENTS

First Embodiment

Figure 1:
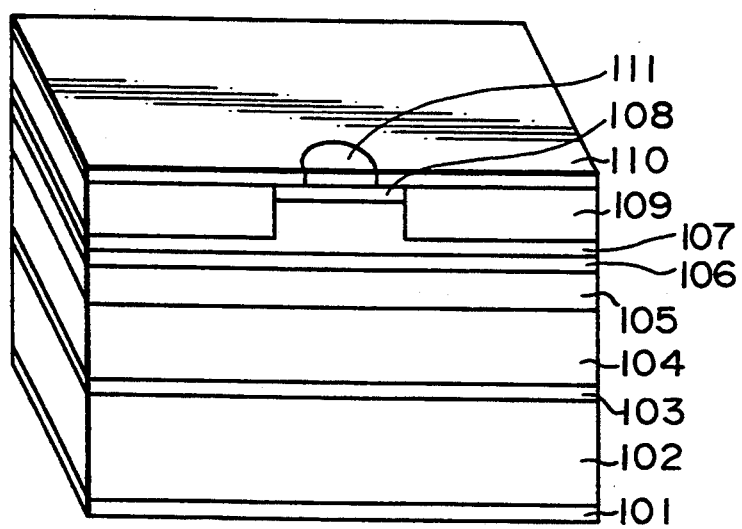
FIG. 1 is a perspective view, partially in section, of a light emitting portion of the first embodiment of a semiconductor laser constructed in accordance with the present invention.

FIG. 1 is a perspective view, partially broken, of a semiconductor laser 100 constructed according to the first embodiment of the present invention while FIG. 2a–2f illustrate various steps in producing the semiconductor laser of the first embodiment.

The semiconductor laser 100 shown in FIG. 1 may be produced according to the following process:

A buffer layer of n-type GaAs 103 of from 0.1 μm to 0.5 μm in thickness is first formed on a substrate of n-type GaAs 102. Over the buffer layer 103, there are formed 30 pairs of distribution reflection type multilayer film mirror 104 which include an n-type $Al_{0.7}Ga_{0.3}As$ layer of from 50 angstrom to 70 angstrom in thickness and an n-type $Al_{0.1}Ga_{0.9}As$ layer of from 50 angstrom to 70 angstrom in thickness and have a reflectivity equal to or higher than 98% against light rays having their wavelength substantially equal to 870 nm. On the multi-layer film mirror 104, there are sequentially formed a cladding layer of n-type $Al_{0.4}Ga_{0.6}As$ 105 of 1.0 μm in thickness, an active layer of p-type GaAs 106 of 0.5 μm in thickness, another cladding layer of p-type $Al_{0.4}Ga_{0.6}As$ 107 of 2.0 μm in thickness and a contact layer of p-type $Al_{0.1}Ga_{0.9}As$ 108 of 0.2 μm in thickness, utilizing the epitaxial growth in the MOCVD process (see FIG. 2a). At this time, for example, the formation of these layers was carried out under such a condition that the temperature on growth is 700° C. and the pressure on growth is 150 Torr., and used organic metals such as TMGa (trimethyl gallium) and TMAl(trimethyl aluminum) as III-group materials, $AsH_3$ as V-group material, $H_2Se$ as n-type dopant and DEZn (diethyl zinc) as p-type dopant.

Figure 2A:
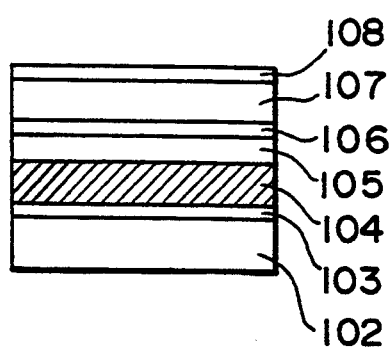
FIGS. 2a–2f are cross-sectional views of the semiconductor laser shown in FIG. 1, illustrating the process of making it.
Figure 2B:
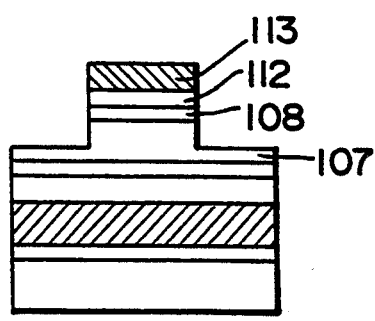

After growth, an $SiO_2$ layer 112 is formed on the top of the multi-layered structure by the thermal CVD process. By the use of the reactive ion beam etching process (RIBE process), the multi-layered structure is etched up to the middle cladding layer of p-type $Al_{0.4}Ga_{0.6}As$ 107, leaving a column-like light emitting portion covered with a hard baked resist layer 113 (FIG. 2b). The etching gas is a mixture of chlorine with argon under a pressure of $1\times10^{-3}$ Torr.. The leading voltage used therein is equal to 400 V. The purpose of the etching of the cladding layer 107 up to the middle thereof is to provide a rib waveguide type refraction waveguide structure which can confine injected carriers and light rays in the active layer.

Figure 2C:
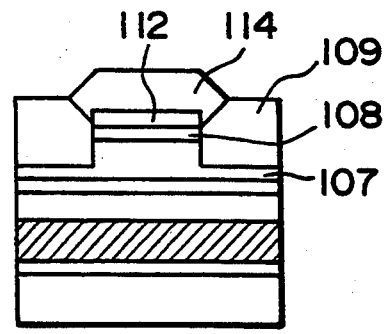

Subsequently, a buried layer is formed on the cladding $Al_{0.4}Ga_{0.6}As$ layer 107. After the resist 113 has been removed, a layer of $ZnS_{0.06}Se_{0.94}$ 109 of from 1.5 μm to 2.5 μm in thickness is then buried and formed using the MOCVD process. In the growth, the temperature is 275° C., the pressure is 70 Torr., and the adduct consisting of II group organometal compound and VI group organometal compound is DMZn-DMSe (dimethyl zinc and dimethyl selenium). This becomes II group material. The VI group hydride is $H_2Se$ (hydrogen selenide) and $H_2S$ (hydrogen sulfide). This becomes VI group material. In this process, a monocrystal layer of $ZnS_{0.06}Se_{0.94}$ 109 grows on the etched top portion of the cladding layer of p-type $Al_{0.4}Ga_{0.6}As$ 107 while a polycrystal layer of $ZnS_{0.06}Se_{0.94}$ 114 grows on the top portion of the layer of $SiO_2$ 112 (FIG. 2c).

Figure 2D:
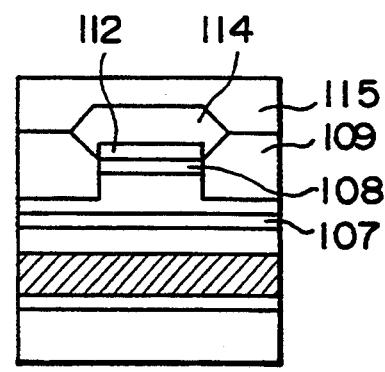

Subsequently, a resist layer 115 having an increased thickness is applied over the entire surface of the multilayered structure, with the surface of the resist layer being then flattened (FIG. 2d). By the use of RIBE process, this assembly is etched until the $SiO_2$ layer 112 is exposed. At this time, the etching rate or the resist 115 is equal to that of the polycrystal $ZnS_{0.06}Se_{0.94}$ layer. Since the $SiO_2$ layer 112 serves as an etching stop layer, the etched surface can be flattened.

Figure 2E:
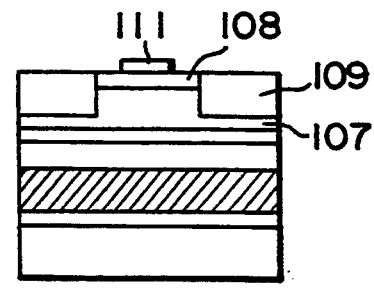

After the $SiO_2$ layer 112 has been removed by the conventional wet-etching, four pairs of multi-layered dielectric films of $SiO_2$/a-Si 111 of 0.8 μm in thickness are then formed on the surface by the use of electron beam deposition. Reactive ion etching(RIE) is then used to remove the material, leaving a region slightly smaller than the diameter of the light emitting portion (FIG. 2e). The reflectivity of the multilayered dielectric film mirror 111 is 94% for wavelength of 870 nm.

Figure 2F:
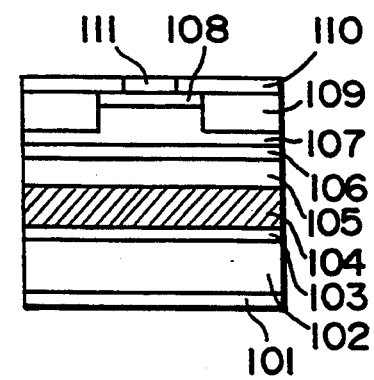

Thereafter, a p-type ohmic electrode 110 is deposited on all the top face except the multi-layered dielectric film 111. An n-type ohmic electrode 101 is further deposited over the semiconductor substrate. In an atmosphere of $N_2$, the entire structure is alloyed at 420° C. to provide a surface emission type semiconductor laser 100 (FIG. 2f).

In the surface emission type semiconductor laser thus formed, the buried layer 109 is in contact with the column-like light emitting portions consisting of the cladding layer 107 and the contact layer 108. In such a structure, the lattice constant of the buried layer ($ZnS_{0.06}Se_{0.94}$) is 5.6531 Angstroms; the lattice constant of the cladding layer ($Al_{0.4}Ga_{0.6}As$) is 5.6562 Angstroms; and the lattice constant of the contact layer ($Al_{0.1}Ga_{0.9}As$) is 5.6540 Angstroms. Thus, the lattice mismatch ratio between the buried layer 109 and the cladding layer 107 or between the buried layer 109 and the contact layer 108 will be very small, that is, 0.055% or 0.016%, respectively. Therefore, the buried layer 109 can be epitaxially grown to the respective layers defining the column-like light emitting portions.

Since the GaAs (a:5.6533) and AlAs (a:5.6605) have their lattice constants approximating to each other, they will not substantially be changed even if the percentage composition x of $Al_xGa_{1-x}As$ is changed.

The surface emission type semiconductor laser according to this embodiment provides a very effective current restriction since the buried $ZnS_{0.06}Se_{0.94}$ layer 109 has a resistance equal to or higher than one GΩ and there is no injection current into the buried layer. Since it is not required that the buried layer is any multi-layered structure, it can be more easily grown with an increased reproductiveness, from one batch to another. The utilization of the rib waveguide structure using the $ZnS_{0.06}Se_{0.94}$ layer which has its refractive index sufficiently smaller than that of GaAs can realize a more effective light confinement.

In order to prevent the tendency of transition and defect produced at the interface of the buried layer ($ZnS_{0.06}Se_{0.94}$ layer), it is desirable that the growth temperature is equal to or lower than 500° C. Since the growth temperature is very low (275° C.) in this embodiment, the interface of the $ZnS_{0.06}Se_{0.94}$ layer can be stably re-grown with reduced transition or defect.

Figure 3:
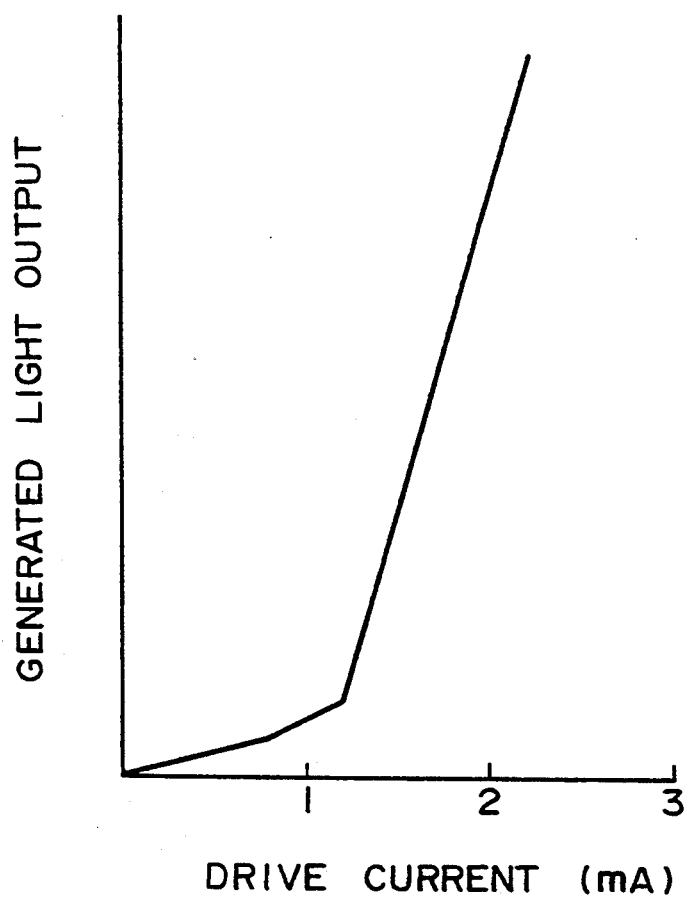
FIG. 3 is a graph illustrating the relationship between the drive current and the generated light output in the semiconductor laser shown in FIG. 1.

FIG. 3 shows the relationship between the drive current and the generated light output in the surface emission type semiconductor laser constructed according to this embodiment. It will be apparent from this graph that the continuous generation can be accomplished at room temperature and the threshold is very low or equal to one mA. Furthermore, the external differential quantum efficiency is increased and the characteristics of the laser is improved by restricting the reactive current.

If the cross-sectional shape of the column-like portion in the surface emission type semiconductor laser according to this embodiment of the present invention is of a circle or regular polygon such as square or regular octagon, a finely circular spot of beam can be provided. However, if this cross-sectional shape is of any configuration other than the above ones, such as rectangle or trapezoid, the cross-section of the laser beam will be ellipse or multi-mode. This is not desirable in applying the semiconductor laser to the devices.

TABLE 2

| Diameter of Column Cross-Section | Mode of Near Field Pattern |
|---|---|
| 2 μm | Zero-Order Basic Mode |
| 5 μm | Zero-Order Basic Mode |
| 10 μm | Zero-Order Basic Mode |
| 12 μm | First-Order Mode |
| 15 μm | First-Order Mode |

Table 2 shows the relationship of near field pattern relative to the diameter of the cross-section of the column-like portion in the surface emission type semiconductor laser according to this embodiment of the present invention. It will be apparent therefrom that if the diameter is equal less than 10 μm, the generation is carried out in the basic mode.

It is preferred that the contact layer in the surface emission type semiconductor laser according to this embodiment of the present invention is of a thickness equal to or less than 3.0 μm. This is because of reduction of the light absorption in the contact layer. Such a thickness is more preferably less than 0.3 μm because the element resistance is reduced and the external differential quantum efficiency is increased.

Second Embodiment

Figure 4:
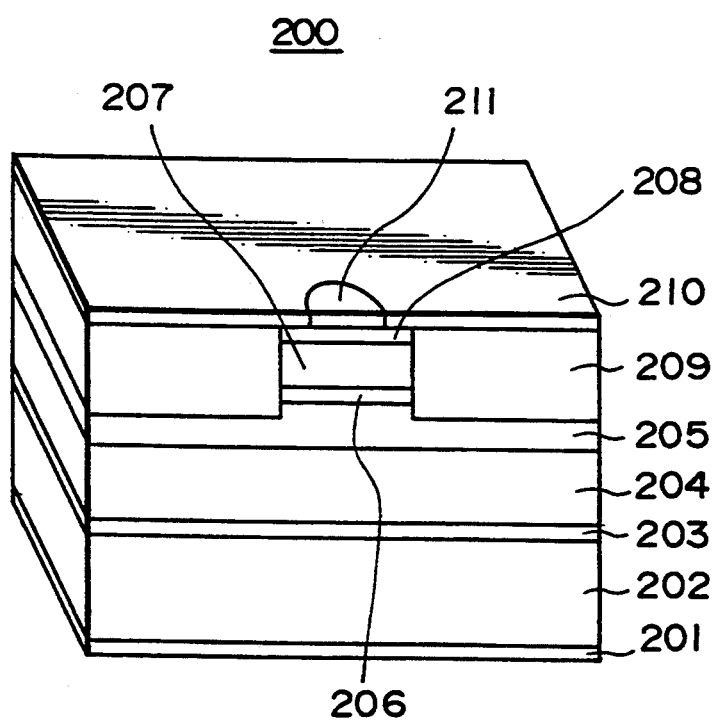
FIG. 4 is a perspective view, partially in section, of a light emitting portion of the second embodiment of a semiconductor laser constructed in accordance with the present invention.

FIG. 4 is a perspective view, partially broken, of the light emitting portion of a semiconductor laser 200 constructed according to the second embodiment of the present invention while FIGS. 5a–5f illustrate various steps for producing the semiconductor laser 200.

The semiconductor laser 200 of the second embodiment is different from that of the first embodiment in that the semiconductor laser 200 comprises a column-like portion defined by a contact layer of p-type $Al_{0.1}Ga_{0.9}As$ 208 through part of a cladding layer of n-type $Al_{0.4}Ga_{0.6}As$ 205.

Figure 5A:
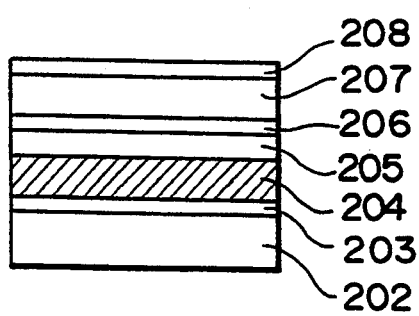
FIGS. 5a–5f are cross-sectional views of the semiconductor laser shown in FIG. 4, illustrating the process of making it.

The semiconductor laser 200 comprises a substrate of n-type GaAs 202 over which a buffer layer of n-type GaAs 203 of from 0.1 $\mu$m to 0.5 $\mu$m in thickness is formed. Over the buffer layer 203, there are formed 30 pairs of distribution reflection type multi-layer film mirror 204 which consists of an n-type AlAs layer of from 50 angstrom to 70 angstrom in thickness and an n-type $Al_{0.1}Ga_{0.9}As$ layer of from 50 angstrom to 70 angstrom in thickness and have a reflectivity equal to or higher than 98% against light rays having their wavelength substantially equal to 870 nm. On the multi-layer film mirror 204, there are sequentially formed a cladding layer of n-type $Al_{0.4}Ga_{0.6}As$ 205 of from 0.5 $\mu$m to 1.0 $\mu$m in thickness, an active layer of p-type GaAs 206 of from 0.1 $\mu$m to 1.0 $\mu$m in thickness, another cladding layer of p-type $Al_{0.4}Ga_{0.6}As$ 207 of from 1.0 $\mu$m to 2.0 $\mu$m in thickness and a contact layer of p-type $Al_{0.1}Ga_{0.9}As$ 208 of from 0.1 $\mu$m to 0.2 $\mu$m in thickness, utilizing the epitaxial growth in the MOCVD process (FIG. 5a). At this time, for example, the formation of these layers was carried out under such a condition that the temperature on growth is 700° C. and the pressure on growth is 150 Torr. and used organometallic compound such as TMGa (trimethyl gallium) and TMAl(trimethyl aluminum) as III-group materials, $AsH_3$ as V-group material, $H_2Se$ as n-type dopant and DEZn (diethyl zinc) as p-type dopant.

After growth, an $SiO_2$ layer 212 is formed on the top of the multi-layered structure by the thermal CVD process. By the use of the reactive ion beam etching process (RIBE process), the multi-layered structure is etched up to the middle of the cladding layer of n-type $Al_{0.4}Ga_{0.6}As$ 205, leaving a column-like light emitting portion covered with a hard baked resist layer 213 (FIG. 5b). The etching gas is a mixture of chlorine with argon under a pressure of $1 \times 10^{-3}$ Torr.. The leading voltage used therein is equal to 400 V.

In order to form a buried layer, the resist layer 213 is removed. After the resist 213 has been removed, a layer of $ZnS_{0.06}Se_{0.94}$ 209 of from 2.5 $\mu$m to 3.5 $\mu$m in thickness is then buried and formed using the MOCVD process. In the growth, the temperature is 275° C., the pressure is 70 Torr., and the adduct consisting of II group organometallic compound and VI group organometallic compound is DMZn-DMSe (dimethyl zinc and dimethyl selenium). This becomes II group material. The VI group hydride is $H_2Se$ (hydrogen selenide) and $H_2S$ (hydrogen sulfide). This becomes VI group material. In this process, a monocrystal layer of $ZnS_{0.06}Se_{0.94}$ 209 grows on the etched top portion while a polycrystal layer of $ZnS_{0.06}Se_{0.94}$ 214 grows on the top portion of the layer of $SiO_2$ 212 (FIG. 5c).

Figure 5D:
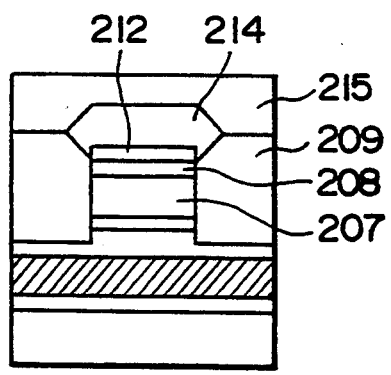
Figure 5B:
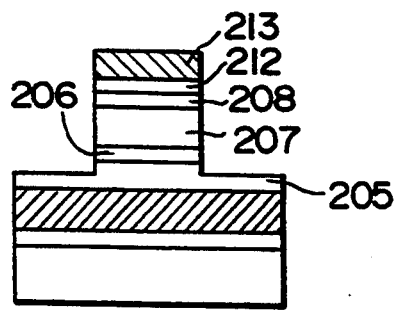

Subsequently, a resist layer 215 having an increased thickness is applied over the entire surface of the multi-layered structure, with the surface of the resist layer being then flattened (FIG. 5d). By the use of RIBE process, this assembly is etched until the $SiO_2$ layer 212 is exposed. At this time, the etching rate of the resist 215 is equal to that of the polycrystal $ZnS_{0.06}Se_{0.94}$ layer. Since the $SiO_2$ layer 212 serves as an etching stop layer, the etched surface can be flattened.

Figure 5E:
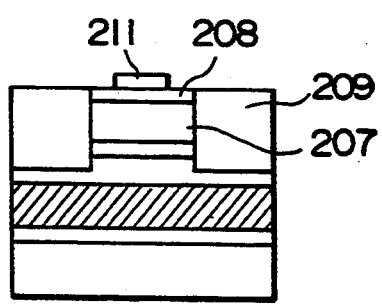
Figure 5C:
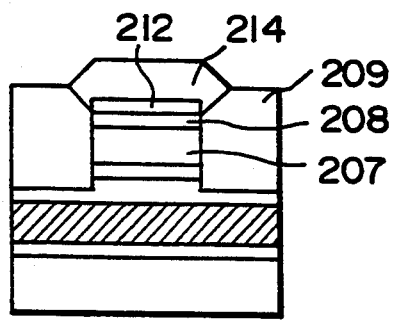

After the $SiO_2$ layer has been removed by using the conventional wet-etching process, four pairs of multi-layered dielectric films of $SiO_2$/a-Si 211 of 0.8 $\mu$m in thickness are then formed on the surface of the multi-layered structure by the use of electron beam deposition. RIE dry-etching is then used to remove the dielectric films, leaving a region slightly smaller than the diameter of the light emitting portion (FIG. 5e). The reflectivity of the multi-layered dielectric films is 94% for wavelength of 870 nm.

Figure 5F:
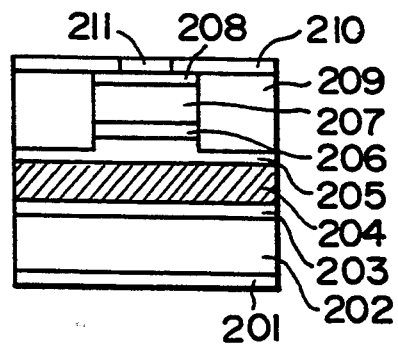

Thereafter, a p-type ohmic electrode 210 is deposited on all the top face except the multi-layered dielectric films 211. An n-type ohmic electrode 201 is further deposited over the semiconductor substrate. In an atmosphere of $N_2$, the entire structure is alloyed at 420° C. to provide a surface emission type semiconductor laser (FIG. 5f).

In the surface emission type semiconductor laser thus formed, the buried layer 209 is in contact with the column-like light emitting portion consisting of the cladding layer 205, the active layer 206, the cladding layer 207 and the contact layer 208. In such a structure, the lattice constant of the buried layer ($ZnS_{0.06}Se_{0.94}$) is 5.6531 Angstroms; the lattice constant of the cladding layer ($Al_{0.4}Ga_{0.6}As$) is 5.6562 Angstroms; the lattice constant of the active layer (GaAs) is 5.6538 Angstroms; and the lattice constant of the contact layer ($Al_{0.1}Ga_{0.9}As$) is 5.6540 Angstroms. Thus, the lattice mismatch ratio between the buried layer 209 and the cladding 207, active 206 or contact 208 layer is very small, that is, 0.055%, 0.004% or 0.016% respectively. Therefore, the buried layer 209 can epitaxially grow to the respective layers defining the column-like light emitting portion.

The surface emission type semiconductor laser according to this embodiment provides a very effective current restriction since the buried layer of $ZnS_{0.06}Se_{0.94}$ has a resistance equal to or higher than one G$\Omega$ and there is no injection current into the buried layer. Since it is not required that the buried layer is any multi-layered structure, it can be more easily grown with an increased reproductiveness from one batch to another. The utilization of the rib waveguide structure using the $ZnS_{0.06}Se_{0.94}$ layer having its refractive index sufficiently smaller than that of GaAs can realize a more effective light confinement with the covering type refraction waveguide structure in which the active layer is buried.

Since the growth temperature of the buried layer ($ZnS_{0.06}Se_{0.94}$ layer) is very low (275° C. in this embodiment) as in the first embodiment, the re-grown interface of the $ZnS_{0.06}Se_{0.94}$ layer can be stabilized with reduced transition or defect.

The active GaAs layer may be replaced by an active layer made of AlGaAs with the equivalent advantage. Even if the column-like portion is formed of any one of the other III-V group compound semiconductors, the equivalent advantage can be provided by selecting any suitable one of the II-V1 group compound semiconductor to form the buried layer.

Third Embodiment

Figure 6:
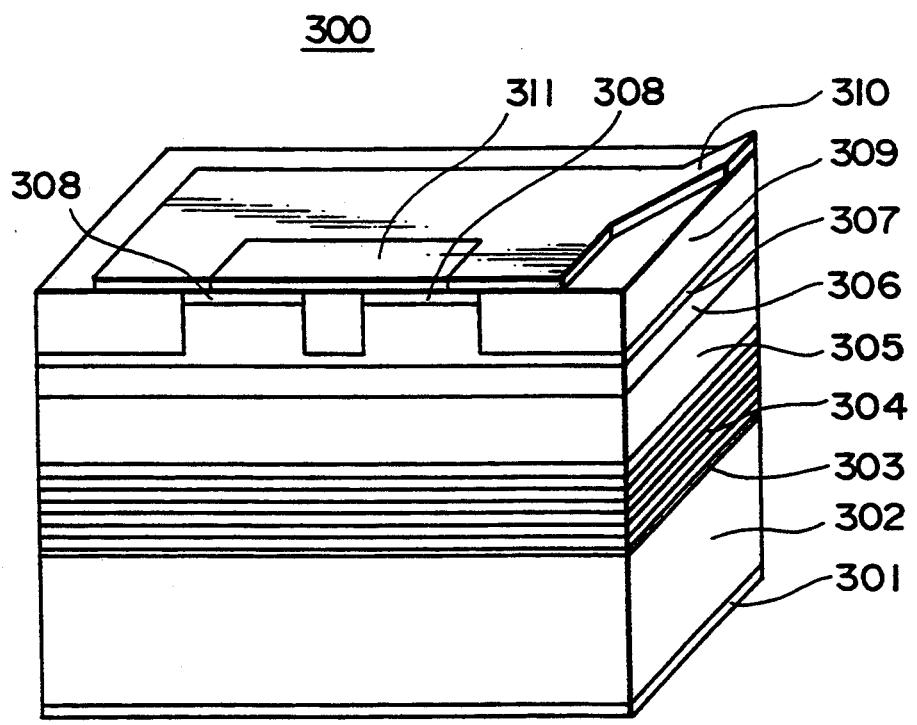
FIG. 6 is a perspective view, partially in section, of a light emitting portion of a surface emission type semiconductor laser constructed in accordance with the third embodiment of the present invention, the semiconductor laser adapted to generate laser beams synchronized in phase.

Referring next to FIG. 6, there is shown the third embodiment of a phase-synchronization type semiconductor 300 constructed in accordance with the present invention, which can increase the dimension of the emission spot. FIGS. 7a–7g illustrate various steps for producing the semiconductor laser 300.

The semiconductor laser 300 is different from those of the first and second embodiments in that the semiconductor laser 300 includes a cladding layer of p-type $Al_{0.5}Ga_{0.5}As$ 307 formed into a plurality of column-like portions which are separated from each other by separation grooves. As the thickness of each layer is similar to that employed for the first embodiment, a description of the thickness is omitted.

Figure 7A:
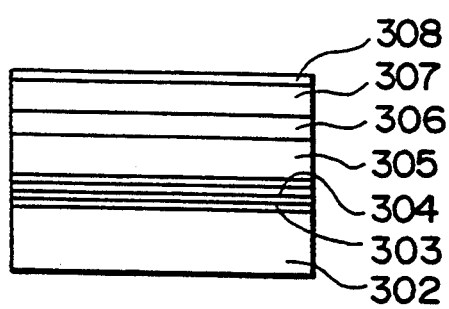
FIGS. 7a–7g are cross-sectional views of the semiconductor laser shown in FIG. 6, illustrating the process of making it.

The semiconductor laser 300 comprises a substrate of n-type GaAs 302 over which a buffer layer of n-type GaAs 303 is formed. Over the buffer layer 303, there are formed 25 pairs of distribution reflection type multi-layer film mirrors 304, each of which includes an n-type $Al_{0.9}Ga_{0.1}As$ layer and an n-type $Al_{0.2}Ga_{0.8}As$ layer and have a reflectivity equal to or higher than 98% against light rays having their wavelength substantially equal to $780\pm30$ nm. On the multi-layer film mirror 304, there are sequentially formed a cladding layer of n-type $Al_{0.5}Ga_{0.5}As$ 305, an active layer of p-type $Al_{0.13}Ga_{0.87}As$ 306, another cladding layer of p-type $Al_{0.5}Ga_{0.5}As$ 307 and a contact layer of p-type $Al_{0.15}Ga_{0.85}As$ 308, utilizing the epitaxial growth in the MOCVD process (FIG. 7a). At this time, for example, the formation of these layers was carried out, for example, under such a condition that the temperature on growth is 720° C. and the pressure on growth is 150 Torr. and used organic metals such as TMGa (trimethyl gallium) and TMAl(trimethyl aluminum) as III-group materials, $AsH_3$ as V-group material, $H_2Se$ as n-type dopant and DEZn (diethyl zinc) as p-type dopant.

After the growth, a $SiO_2$ layer is formed on the top of the multi-layered structure in the atmospheric pressure by the thermal CVD process. A photoresist is then applied over the $SiO_2$ layer and baked at a raised temperature to form a hard baked resist. A further $SiO_2$ layer is formed over the hard baked resist by the EB deposition.

The respective layers formed on the substrate are then etched by the use of the reactive ion etching process (RIE process). The $SiO_2$ layer formed on the hard baked resist 313 is first subjected to the conventional photolithograph to form a necessary resist pattern. This resist pattern is then used as a mask to perform the RIE process against the $SiO_2$ layer. For example, the RIE process may be carried out by using $CF_4$ gas under a pressure of 4.5 Pa and an input RE power of 150 W and by controlling the sample holder at 20° C.

Figure 7B:
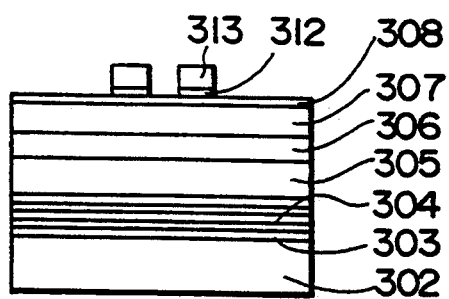

This $SiO_2$ layer is then utilized as a mask to etch the hard baked resist 313 by the RIE process which uses, for example, $O_2$ gas under a pressure of 4.5 Pa and an input power of 150 W and controls the sample holder at 20° C. At the same time, the resist pattern initially formed on the $SiO_2$ layer is also etched. In order to etch both the $SiO_2$ layer left in the pattern and the $SiO_2$ layer 312 formed on the epitaxial layer simultaneously the etching is again performed by the use of $CF_4$ gas. By using the thin $SiO_2$ layer as a mask and performing the RIE process which is one of the dry etching processes against the hard baked resist 313, the latter may include side walls perpendicular to the substrate while maintaining the necessary pattern (FIG. 7b).

Figure 7C:
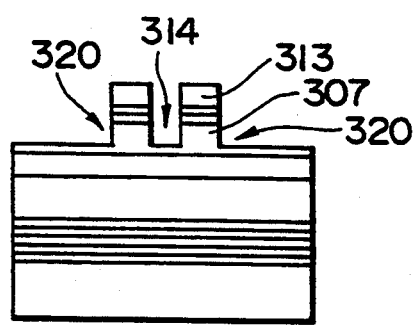

The hard baked resist 313 having such vertical side walls is used as a mask in the reactive ion beam etching (RIBE) process so that the cladding layer of p-type $Al_{0.5}Ga_{0.5}As$ 307 is etched up to its middle, leaving a plurality of column-like light emitting portions (FIG. 7c). The etching gas used herein is a mixture of chlorine with argon under a pressure equal to $5\times10^{-4}$ Torr. and a plasma generating voltage equal to 400 V. The RIBE process is carried out at the current density of ion equal to 400 $\mu A/cm^2$ on the etching sample while maintaining the sample holder at 20° C. The purpose of etching the cladding layer 307 up to its middle is to provide a refraction waveguide type rib waveguide structure for confining the horizontal injection carriers and light rays in the active layer such that a part of the light rays can be transmitted in the horizontal direction within the active layer.

If the RIBE process in which an ion beam is irradiated perpendicular to the hard baked resist 313 having its vertical side walls and the etching sample to etch them is used, the light emitting portions 320 arranged closed to each other can be separated from each other by a separation groove 314 and at the same time it is possible to produce a vertical light resonator which is required to improve the characteristics of the surface emission type semiconductor laser.

Figure 7D:
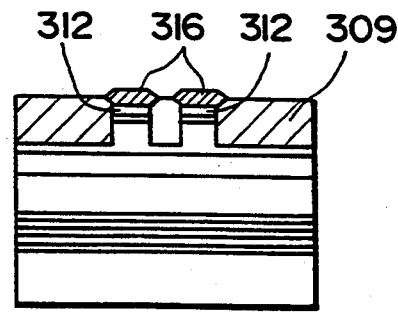

After the resist 313 has been removed, a layer of $ZnS_{0.06}Se_{0.94}$ 309 is then buried and formed using the MOCVD process. In the growth, the temperature is 275° C., the pressure is 70 Torr., and the adduct consisting of II group organometallic compound and V1 group organometallic compound is DMZn-DMSe (dimethyl zinc and dimethyl selenium). This becomes II group material. The VI group hydride is $H_2Se$(hydrogen selenide) and $H_2S$ (hydrogen sulfide). This becomes VI group material. In this process, a monocrystal layer of $ZnS_{0.06}Se_{0.94}$ 309 grows on the etched top portion while a polycrystal layer of $ZnS_{0.06}Se_{0.94}$ 316 grows on the top portion of the layer of $SiO_2$ 312 (FIG. 7d).

Figure 7E:
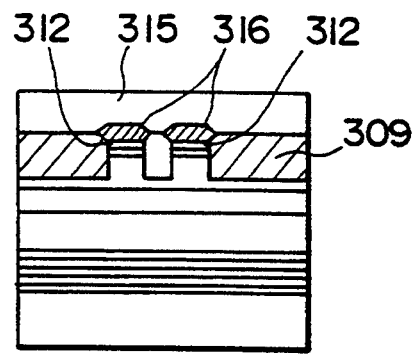

Subsequently, a resist layer 315 having an increased thickness is applied over the entire surface of the multi-layered structure, with the surface of the resist layer being then flattened (FIG. 7e). By the use of RIBE process, this assembly is etched until the $SiO_2$ layer 312 is exposed. At this time, the etching rate of the resist 315 is equal to that of the polycrystal $ZnS_{0.06}Se_{0.94}$ layer 316. Since the $SiO_2$ layer 312 serves as an etching stop layer, the etched surface can be flattened.

Figure 7F:
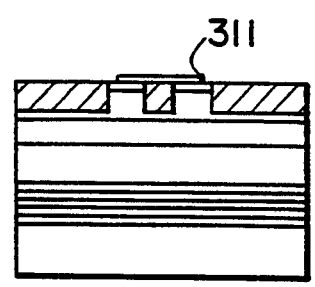

After the $SiO_2$ layer has been removed by using the conventional wet-etching process, four pairs of multi-layered dielectric film mirrors of $SiO_2$/a-Si 311 are then formed on the surface of the multi-layered structure by the use of electron beam deposition. Thereafter, the material is removed except part of the light emitting portion 320 separated by using the dry-etching process and the buried layer sandwiched by the light emitting portions 320 (FIG. 7f). The reflectivity of the multi-layered dielectric film mirror at wavelength of 780 nm is 95% or more. Since the multi-layered dielectric film mirror 311 is also formed over the separation groove 314 buried with ZnSSe, a vertical resonator structure is also formed at the region between the adjacent light emitting portions. As a result, light rays leaked into the separation groove 314 effectively contributes to the laser generation. Since the leaked light rays are utilized, the emitted light can be synchronized with the phase at the light emitting portions 320.

Figure 7G:
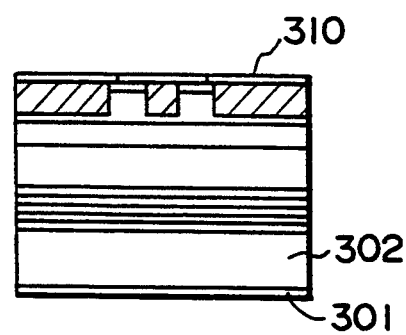

Thereafter, a p-type ohmic electrode 310 is deposited on the top face except the multi-layered dielectric film mirror 311. An n-type ohmic electrode 301 is deposited on the bottom face of the substrate. The structure thus formed is alloyed at 420° C. in the atmosphere of $N_2$ to complete the surface emission type semiconductor laser 300 (FIG. 7g). The n-type ohmic electrode 310 on the exit side is formed to connect with the contact layer 308 in each of the light emitting portion.

In the surface emission type semidoncuctor laser thus formed, the buried layer 309 is in contact with the column-like light emitting portion consisting of the cladding layer 307 and the contact layer 308. In such a structure, the lattice constant of the buried layer ($ZnS_{0.06}Se_{0.94}$) is 5.6531 Angstroms; the lattice constant of the cladding layer ($Al_{0.5}Ga_{0.5}As$) is 5.6569 Angstroms; and the lattice constant of the contact layer ($Al_{0.15}Ga_{0.85}As$) is 5.6544 Angstroms. Thus, the lattice mismatch ratio between the buried layer 309 and the cladding 307 or contact 308 layer is very small, that is, 0.067% or 0.023%, respectively. Therefore, the buried layer 309 can epitaxially grow to the respective layers defining the column-like light emitting portion.

Since the surface emission type semiconductor laser produced according to this embodiment utilizes the epitaxial ZnSSe layer 309 as a buried layer, it can have a resistance equal to or higher than one $G\Omega$, which is higher than that of the prior art blocking structure using a counter bias at the p-n junction in the AlGaAs layer. This provides an optimum current blocking structure. Moreover, the light leaked from the light emitting portion 320 can be effectively utilized since the buried layer is made of a transparent material having less absorption for the generation wavelength of 780 nm.

Figure 12:
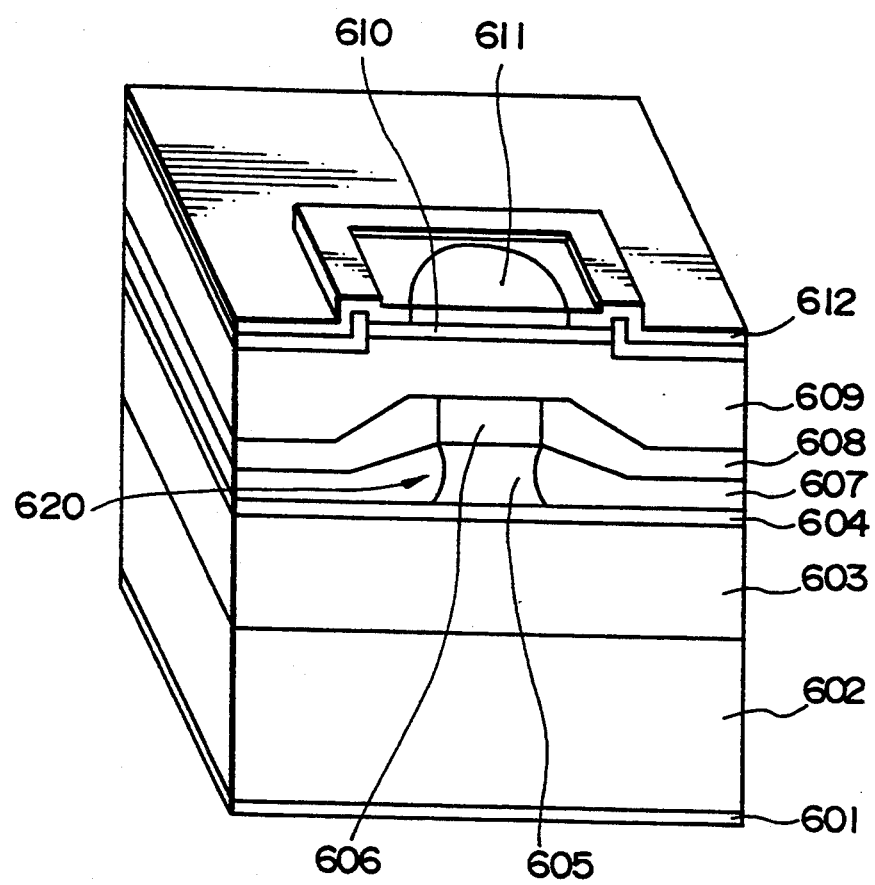
FIG. 12 is a perspective view of a surface emission type semiconductor laser constructed according to the prior art, illustrating the light emitting portion thereof.

FIG. 8 shows the arrangements of the surface emission type semiconductor lasers constructed respectively in accordance with the prior art and the present invention at the exit sides thereof and intensity profiles of NFP when the laser beam is generated. FIG. 8a shows that the resonators 620 of the prior art surface emission type semiconductor laser 600 shown in FIG. 12 are arranged close to one another up to a distance by which the resonators can be fully covered by the epitaxial layers of GaAlAs 607 and 608 connected with each other at the n-p junction, that is, a distance equal to about 5 $\mu$m. Although the exit face of the laser actually includes the multi-layered dielectric film mirror and the p-type ohmic electrode formed thereon, they are omitted in FIG. 8 for clear illustration. FIG. 8b shows an intensity profile of NFP between points a and b in FIG. 8a. The surface emission type semiconductor laser of the prior art only can provide a plurality of adjacent light spots even if a plurality of light emitting portions 620 are arranged close to each other. This is because the semiconductor laser of the prior art has NFP of multi-peak property without lateral leakage of light.

Figure 8A:
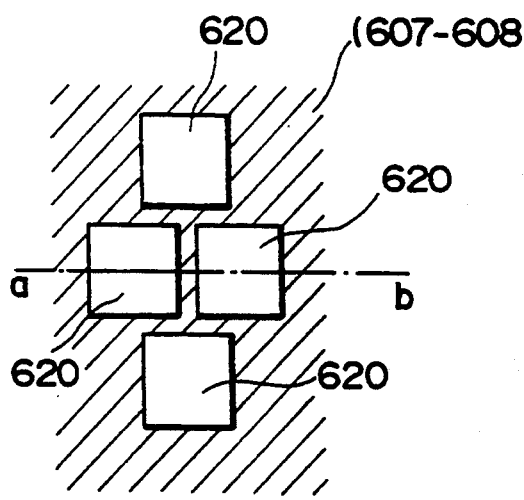
FIGS. 8a–8d illustrate differences in shape and near field pattern between the surface emission type semiconductor laser constructed according to the prior art and the semiconductor laser of FIG. 6.
Figure 8C:
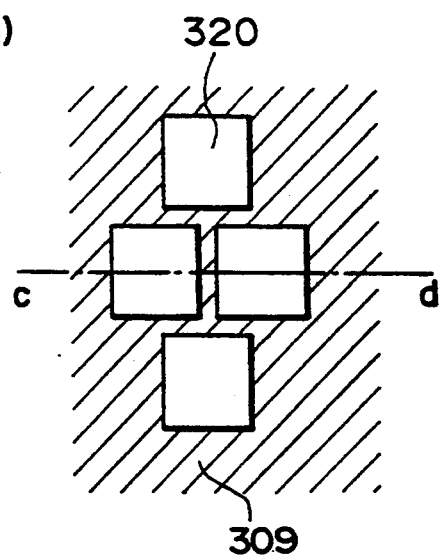
Figure 8B:
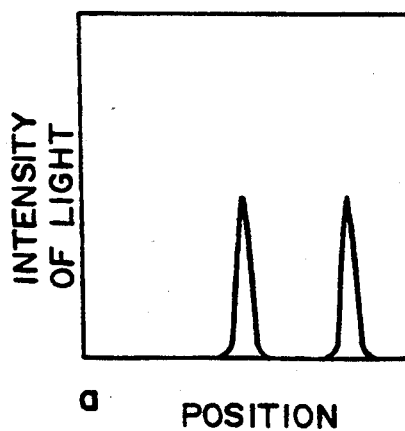
Figure 8D:
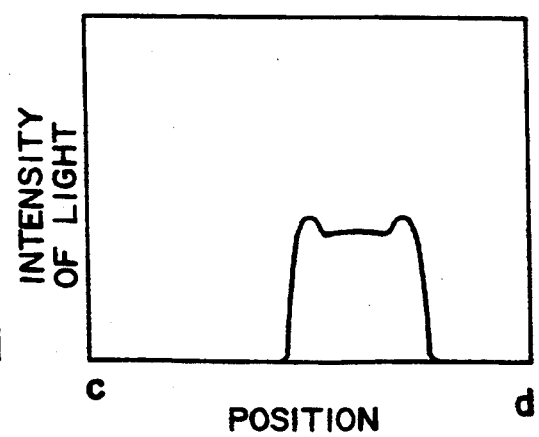
Figure 10A:
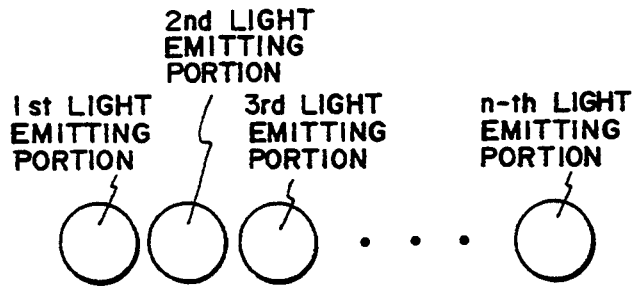
FIGS. 10a–10d schematically illustrate various shapes of surface emission type semiconductor lasers constructed according to still further embodiments of the present invention at the exit sides thereof.
Figure 10B:
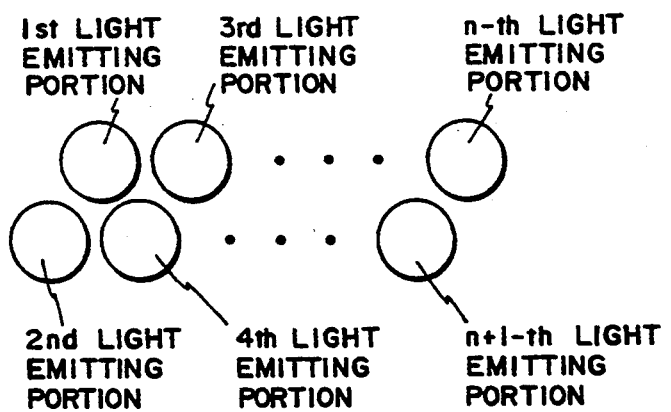
Figure 10C:
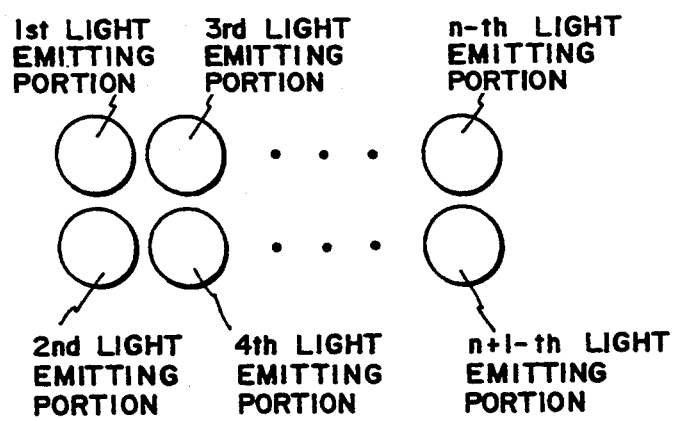
Figure 10D:
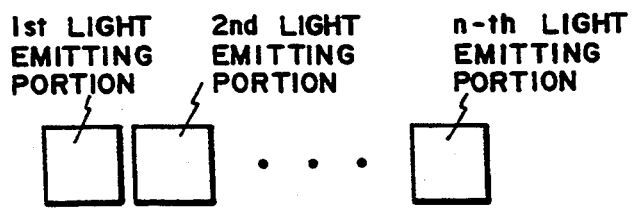

FIG. 8c shows the configuration of the surface emission type semiconductor laser constructed according to this embodiment wherein the separation groove is filled with a $ZnS_{0.06}Se_{0.94}$ layer 409 which formed by the vapor phase epitaxy method. Thus, the minimum width of the separation groove can be equal to one $\mu$m. FIG. 8d shows NFP between points c and d in FIG. 8c. It will be apparent from this NFP that the light emission spot is enlarged since light rays exit also from above the separation groove 314. Since the adjacent laser beams are synchronized with each other in phase the light output can be increased with a circular beam being provided having an angle of radiation being equal to or less than one degree.

Table 3 shows the relationship between the width of the separation groove 314 of the surface emission type semiconductor laser 300 and the order of transverse generation mode measured from NFP.

TABLE 3

| Width of Separation Groove | Mode of Near Field Pattern |
| --- | --- |
| 0.5 $\mu$m | Zero-Order Basic Mode |
| 1.0 $\mu$m | Zero-Order Basic Mode |
| 5.0 $\mu$m | Zero-Order Basic Mode |
| 10 $\mu$m | First-Order Mode |
| 20 $\mu$m | Higher-Order Mode |

If the width of the separation groove is less than 10 $\mu$m, the transverse generation mode of the laser synchronized in phase is in the basic mode. If the width is equal to or more than 10 $\mu$m, the laser will be generated in an order equal to or higher than one. In this case, the laser beam will be of an elliptic configuration with its increased angle of radiation. This is undesirable in all the applications. If the separation groove has a width less than 0.5 $\mu$m, the laser beam will not be circular.

Although the embodiments have been described as to a single optical resonator including a plurality of light emitting portions spaced away from one another, a plurality of such optical resonators may be formed on the same semiconductor substrate. If each of the optical resonators has a p-type ohmic electrode at its exit side, a laser beam from each optical resonator may be independently controlled with respect to ON, OFF and modulation.

Although the embodiments have been described as to the surface emission type semiconductor laser made of GaAlAs materials, the other III–V group compounds may be equivalently used in the present invention. Particularly, the generation wavelength may be varied by changing the composition of Al in the active layer of $Ga_{0.87}Al_{0.13}As$.

Although this embodiment has been described in connection with the structure shown in FIG. 6 and the light emitting portion shown in FIG. 8c, the present invention is not limited to such an arrangement.

Figure 11A:
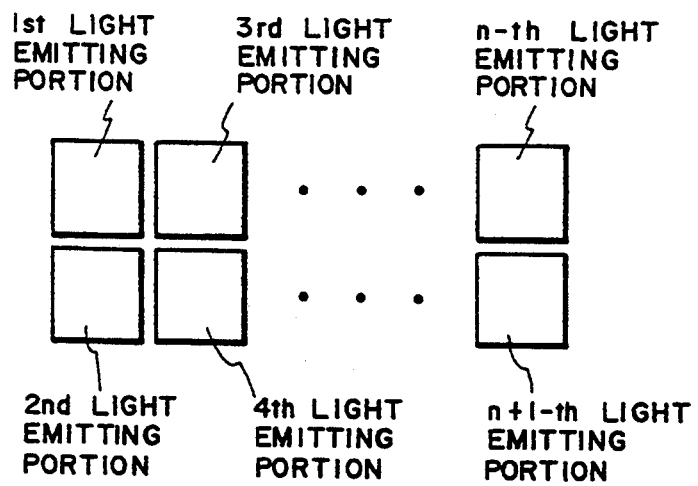
FIGS. 11a–11c schematically illustrate various shapes of surface emission type semiconductor lasers constructed according to other embodiments of the present invention at the exit sides thereof.
Figure 11B:
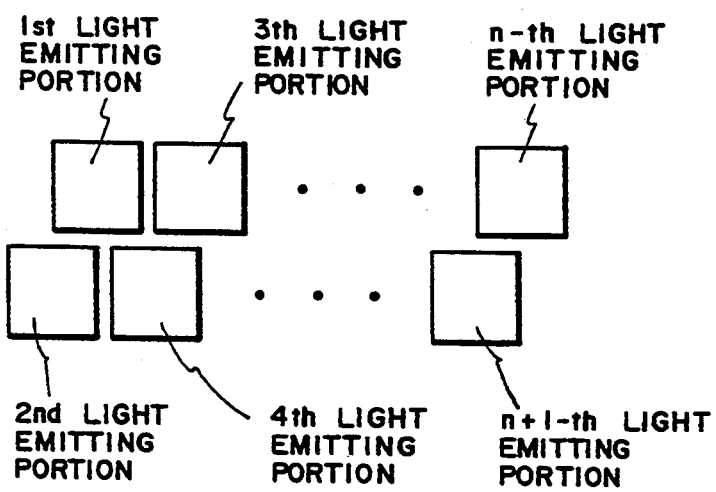
Figure 11C:
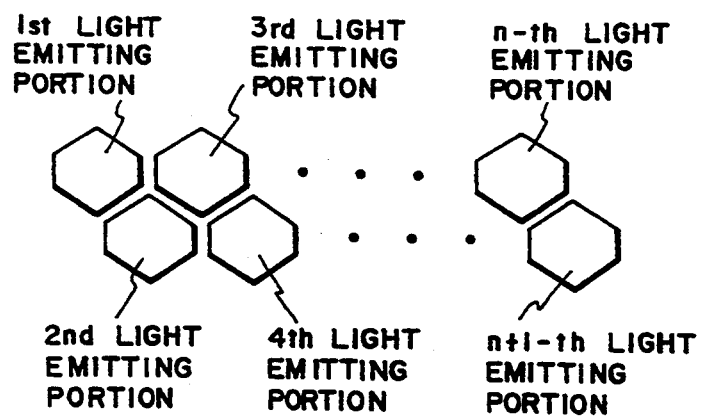

FIGS. 9 to 11 show the other embodiments of the present invention in which various configurations and arrangements of optical resonators and associated separation grooves in a plane parallel to the substrate as viewed from the exit side are schematically illustrated. FIGS. 9a–9j and 9m represent line symmetry arrangements in which a plurality of column-like semiconductor layers each having a circular or regularly polygonal cross-section parallel to the substrate are formed. In any event, the light emitting spot formed by any one of such arrangements can have a dimension larger than that of a light emitting spot formed by a single light emitting portion. When it desired to provide a single circular cross-sectional laser beam having a relatively large diameter from the respective light emitting portions and separation groove, the cross-section of each of the light emitting portions may be any configuration other than circle or regular polygon, as shown in FIGS. 9k and 9l.

The essential requirement in the concept of the present invention is that a non-circular or non-polygonal line joining the outer edges of the light emitting portions arranged in line symmetry approximate to a circular or regularly polygonal configuration. So, the configurations shown in FIG. 9k and 9l are suitable for generating the laser beam having larger diameter. Each of embodiments shown in FIGS. 10a–10d and 11a–11c includes light emitting portions of n in number and is advantageous in that it can produce a light emitting spot formed into any desirable size and form, in addition to the same advantages as in the embodiment of FIG. 6. In all the embodiments shown in FIGS. 10 and 11, a line beam may be provided by disposing a plurality of light emitting portions in row and/or column on a two-dimensional plane parallel to the substrate.

In the embodiment shown in FIG. 6, there may be produced a semiconductor laser which comprises a plurality of spaced p-type ohmic electrodes 310 equal in number to the light emitting portions 320, these electrodes 810 being connected with the contact layer 308. In such a case, each of the light emitting portions will generate a beam having a circular cross-section which can be independently controlled in ON, OFF and modulation, these beams being synchronized with one another in phase.

Fourth Embodiment

Figure 13:
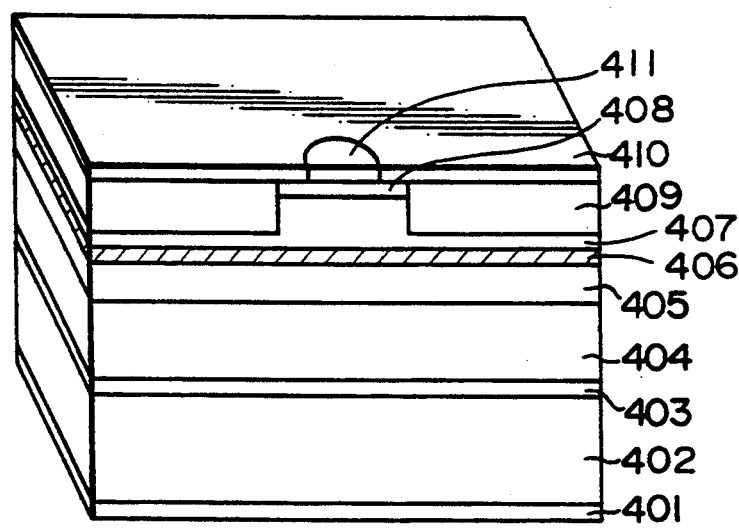
FIG. 13 is a perspective view, partially broken, of the light emitting portion of a semiconductor laser constructed according to the fourth embodiment of the present invention.
Figure 14:
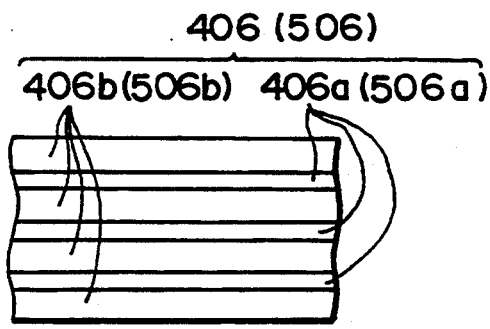
FIG. 14 is an enlarged cross-sectional view or the active layer of MQW structure in the semiconductor laser shown in FIG. 13.

FIG. 13 shows a cross-sectional view of an emitting portion of a semiconductor laser 400 and FIG. 14 shows an active layer, constructed in accordance with one embodiment of the present invention.

The semiconductor laser 400 in this embodiment has substantially the same structure and process of manufacturing as the semiconductor laser 100 in the first embodiment except the structure of the active layer.

The semiconductor laser 400 comprises a substrate of n-type GaAs 402 over which a buffer layer of n-type GaAs 403 is formed. Over the buffer layer 403, there are formed 30 pairs of distribution reflection type multilayer film mirror 404 which include an n-type $Al_{0.7}Ga_{0.3}As$ layer and an n-type $Al_{0.1}Ga_{0.9}As$ layer and have a reflectivity equal to or higher than 98% against light rays having their wavelength substantially equal to 870 nm. On the multi-layer film mirror 404, there are sequentially formed a cladding layer of n-type $Al_{0.4}Ga_{0.6}As$ 405, an active layer of multi-quantum well(HQW) structure 406, another cladding layer of p-type $Al_{0.4}Ga_{0.6}As$ 407 and a contact layer of p-type $Al_{0.1}Ga_{0.9}As$ 408, utilizing the epitaxial growth in the MOCVD process.

For example, the active MQW layer 406 comprises three well layers 406a, as shown in FIG. 14. Each of the well layers 406a is sandwiched between a pair of upper and lower barrier layers 406b. Each of the well layers 406a may be formed as of an i-type GaAs film having a thickness equal to 120 Angstroms while each of the barrier layers 406b may be formed as of an i-type $Ga_{0.65}Al_{0.35}As$ film having a thickness equal to 150 Angstroms.

In the following process, etching a cladding layer of p-type $Al_{0.4}Ga_{0.6}As$ 407, growing a layer of $ZnS_{0.06}Se_{0.94}$ 409 which is in lattice alignment with GaAs, and forming ohmic electrodes 410 and 401 are performed in the same manner as the first embodiment to produce the semiconductor laser 400.

In the surface emission type semiconductor laser thus formed, the buried layer 409 is in contact with a column-like light emitting portion consisting of the cladding layer 407 and the contact layer 408. In such a structure, the lattice constant of the buried layer ($ZnS_{0.06}Se_{0.94}$) is 5.6531 Angstroms; the lattice constant of the cladding layer ($Al_{0.4}Ga_{0.6}As$) is 5.6562 Angstroms; and the contact layer ($Al_{0.1}Ga_{0.9}As$) is 5.6540 Angstroms. Thus, the lattice mismatch ratio between the buried layer 409 and the cladding 407 or contact 408 layer is very small, that is, 0.055% or 0.016%, respectively. Therefore, the buried layer 409 can epitaxially grow to the respective layers defining the column-like light emitting portion.

The surface emission type semiconductor laser according to this embodiment provides a very effective current restriction since the buried layer 409 of $ZnS_{0.06}Se_{0.94}$ has a resistance equal to or higher than one $G\Omega$ and there is no injection current into the buried layer as well as the first embodiment. In this embodiment, further, the active MQW layer 406 contributes to the reduction of generating threshold current.

Figure 15:
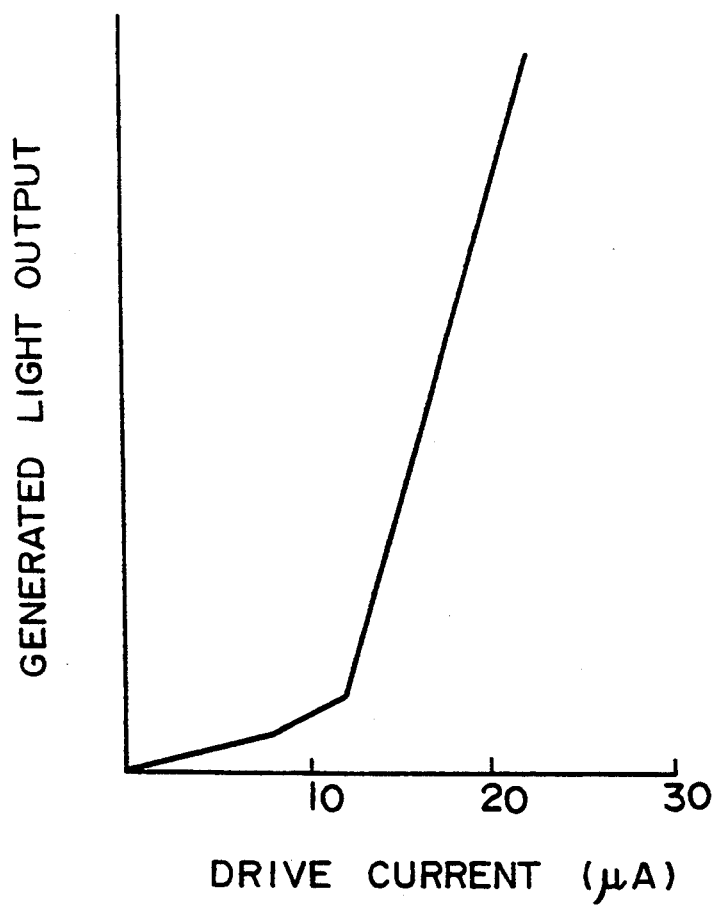
FIG. 15 is a graph illustrating the relationship between the drive current and the emitted light output in the semiconductor laser shown in FIG. 13.

FIG. 15 shows the relationship between the drive current and the generated light output in the surface emission type semiconductor laser according to this embodiment. In this embodiment, the continuous generation of laser beam can be accomplished in room temperature with a threshold level as low as 10 $\mu A$ by using the buried layer of II–VI group compound semiconductor 409 and the active MQW layer 406. If any active HQW layer is not used, the continuous generation of laser beam can be attained, but the threshold current will be as large as one mA. The active MQW layer serves to provide a light output at least five times higher than a case where no active layer of HQW structure is taken, for example, 25 mW or higher. Furthermore, the external differential quantum efficiency is increased and the characteristics of the laser is improved by restricting the reactive current.

If the active layer is of HQW structure, its gain is increased with the light output being increased. If the material of the active layer is changed from one to another, the wavelength of generation also is naturally varied. However, the present invention performs the change of the wavelength by varying the MQW structure while using the same material.

Figure 16:
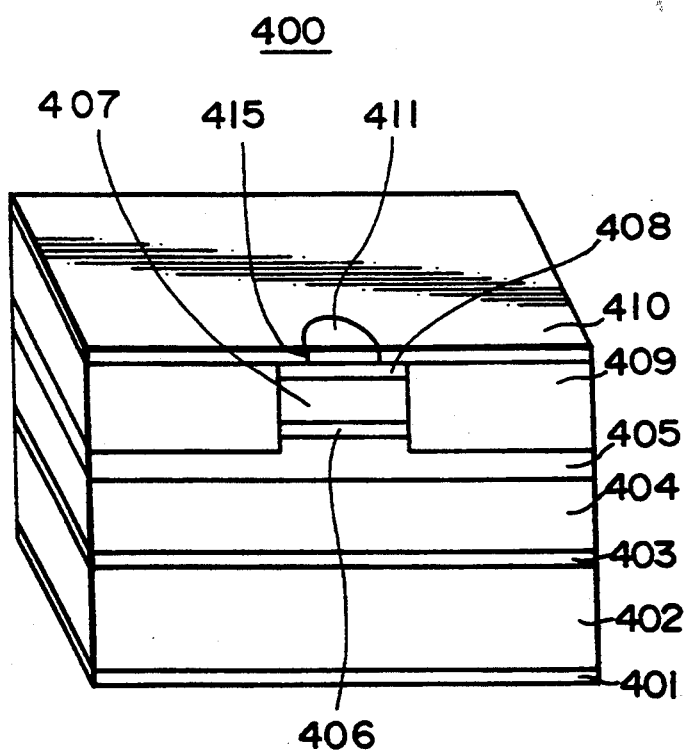
FIG. 16 is a perspective view, partially broken, of the light emitting portion of a surface emission type semiconductor laser constructed according to a further embodiment of the present invention.

The present invention can be applied to a buried type refractive index waveguide structure as well as the second embodiment, as shown in FIG. 16, rather than the aforementioned rib waveguide type refractive index waveguide structure. In this case, the column-like portions are formed to extend to the underlying cladding layer 405. As a result, the active MQW layer 406 will also be formed into a column-like configuration and enclosed by the buried layer 409.

Fifthe Embodiment

Figure 17:
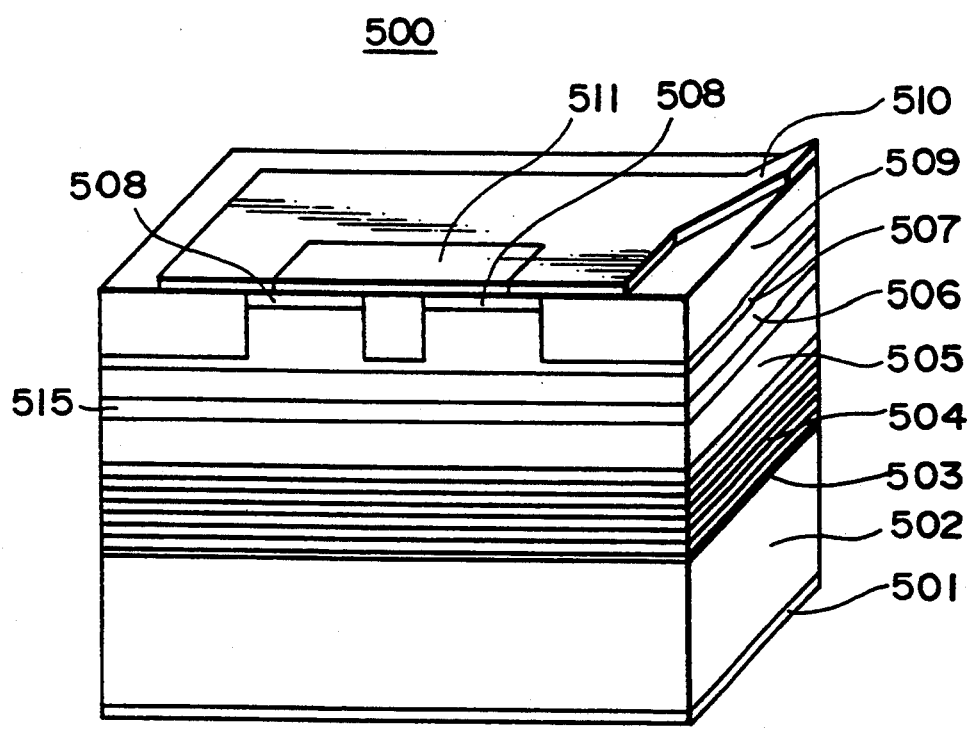
FIG. 17 is a perspective view, partially broken, of the light emitting portion of a phase-locked surface emission type semiconductor laser constructed according to the fifth embodiment of the present invention.

Referring to FIG. 17, there is shown still another embodiment of a phase-synchronization type semiconductor laser 500 constructed in accordance with the present invention, which can increase the dimension of the emission spot.

The semiconductor laser 500 comprises a substrate of n-type GaAs 502 over which a buffer layer of n-type GaAs 508 is formed. Over the buffer layer 503, there are formed 25 pairs of distribution reflection type multilayer film mirror 504 which includes an n-type $Al_{0.9}Ga_{0.1}As$ layer and an n-type $Al_{0.2}Ga_{0.8}As$ layer and have a reflectivity equal to or higher than 98% against light rays having their wavelength substantially equal to $780\pm30$ nm. On the multi-layer film mirror 504, there are sequentially formed a cladding layer of n-type $Al_{0.5}Ga_{0.5}As$ 505, a waveguide layer 515, an active layer of multi-quantum well (MQW) structure 506, another cladding layer of p-type $Al_{0.5}Ga_{0.5}As$ 507 and a contact layer of p-type $Al_{0.15}Ga_{0.85}As$ 508, utilizing the epitaxial growth in the MOCVD process.

At this time, for example, the active MQW layer 506 comprises three well layers 506a, each of which is sandwiched between a pair of upper and lower barrier layers 506b, as shown in FIG. 14. Each of the well layers 506a may be formed of an i-type $Ga_{0.65}Al_{0.35}As$ film having a thickness equal to 80 Angstroms while each of the barrier layers 506b is made of an i-type $Ga_{0.95}Al_{0.05}As$ film having a thickness equal to 60 Angstroms. The waveguide layer 515 has a composition of Al ranging between those of the well and barrier layers 506a, 506b and may be formed of an n-type epitaxial layer of $Ga_{0.75}Al_{0.25}As$. Such a waveguide layer 515 has a refractive index lower than the equivalent refractive index of the active MQW layer 506 but higher than the refractive index of the underlying cladding layer 505.

In the following process, etching a cladding a layer of p-type $Al_{0.4}Ga_{0.6}As$ 507, growing a layer of $ZnS_{0.06}Se_{0.94}$ 509 which are in lattice alignment with GaAs, and forming ohmic electrodes 510 and 501 is performed in the same manner as the third embodiment to produce the semiconductor laser 500.

The purpose of etching the cladding layer 507 up to its middle is to provide a refraction waveguide type rib waveguide structure for confining the horizontal injeciton carriers and light rays in the active MQW layer 506 such that a part of the light rays can be transmitted in the horizontal direction within the active layer. In this embodiment, the propagation of light in the horizontal direction may be assured by the waveguide layer 515.

In the surface emission tyep semiconductor laser thus formed, the buried layer 509 is in contact with the column-like light emitting portion consisting of the cladding layer 507 and the contact layer 508. In such a structure, the lattice constant of the buried layer ($ZnS_{0.06}Se_{0.94}$) is 5.6531 Angstroms; the lattice constant of the cladding layer ($Al_{0.5}Ga_{0.5}As$) is 5.6569 Angstroms; and the lattice constant of the contact layer ($Al_{0.15}Ga_{0.85}As$) is 5.6544 Angstroms. Thus, the lattice mismatch ratio between the buried layer 509 and the cladding 507 or contact 508 layer is very small, that is, 0.067% or 0.023%, respectively. Therefore, the buried layer 509 can epitaxially grow relative to the respective layers defining the column-like light emitting portion.

Since the surface emission type semiconductor laser 500 utilizes the epitaxial ZnSSe layer 509 as a buried layer, it can have a resistance equal to or higher than one $G\Omega$, which is higher than that of the prior art blocking structure using a counter bias at the p-n junction in the AlGaAs layer. This provides an optimum current blocking structure. As a result, the generating threshold current can be reduced. In addition, the active MQW layer 506 also serves to reduce the generating threshold current, for example, to a level of about ten $\mu A$ as well as the fourth embodiment. Furthermore, the light emitting portions 520 separated from each other by the separation groove 514 can be influenced by each other through the active and waveguide layers 506 and 515. Thus, light rays from the respective light emitting portions 520 can be synchronized with each other in phase, resulting in generation of a laser beam having an increased diameter and an emphasized intensity.

Even though a plurality of column-like portions arranged in a two-dimensional array are formed within a finely small area as mentioned in the third embodiment, the present invention can reduce the reactive current such that the surface emission type semiconductor laser can be simultameously and continuousy driven a plurality of the light emitting element in room temperature. In order to increase the advantage of the phase synchronization, the waveguide layer is preferably located at the lower layer section of the active layer of HQW structure. In this case, the influence between the light emitting portions will be emphasized to facilitate the phase synchronization, for example, even if the respective light emitting portions are spaced farther away from one another.

Sixth Embodiment

Referring to a semiconductor laser in this embodiment, which is the same type as the aforementioned first embodiment (FIG. 1), the exit-side multi-layered dielectric film mirror 111 is formed to have a surface area ranging between 10% and 90% of the surface area of the contact layer 108.

An opening of the exit-side electrode in which the exit-side multi-layered dielectric film mirror 111 is to be located is formed at a region in which the highest light emission efficiency can be obtained, that is, within a range including the geometric center of the contact layer 108. If the cross-sectional area of the opening is larger than 90% of the surface area of the contact layer 108, it becomes difficult to perform the continuous generation in room temperature since the resistance is increased. On the contrary, if the cross-sectional area of the opening is less than 10% of the surface area of the contact layer 108, the opening is too small to provide a necessary light output. Therefore, the opening area should be ranged between 10% and 90% of the surface area of the contact layer. If so done, the configuration and magnitude of the light spot may be changed without any change of the cross-sectional shape of the column-like portions parallel to the semiconductor substrate, depending on the shape and cross-sectional area of the opening.

The surface emission type semiconductor laser thus formed provides a very effective current restriction since the buried layer 109 of $ZnS_{0.06}Se_{0.94}$ has a resistance equal to or higher than one $G\Omega$ and there is no injection current into the buried layer, as well as the aforementioned first embodiment. Since it is not required that the buried layer is any multi-layered structure, it can be more easily grown with an increased reproductiveness consistency from one batch to another. The utilization of the rib waveguide structure using the $ZnS_{0.06}Se_{0.94}$ layer having its refractive index sufficiently smaller than that of GaAs can realize a more effective light confinement. And the continuous generation can be accomplished at room temperature and the threshold is very low, or equal to one mA. Furthermore, the external differential quantum efficiency is increased and the characteristics of the laser is improved by restricting the reactive current.

Figure 18A:
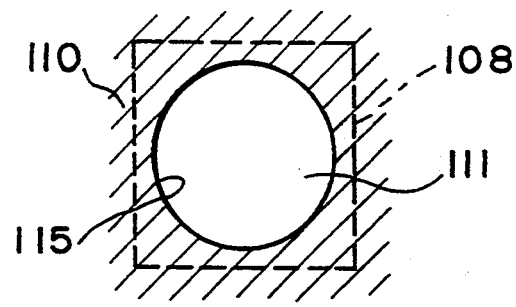
FIGS. 18a–18d schematically illustrate the different shapes of opening in the electrode of a semiconductor laser constructed according to the sixth embodiment of the present invention at the light exit side thereof.
Figure 18B:
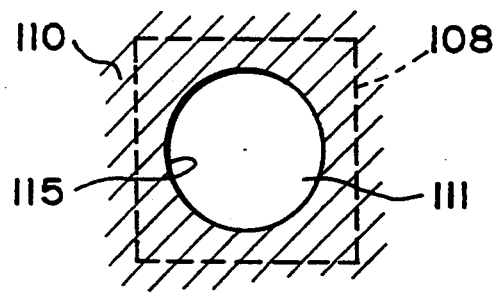

Considering the configuration of a generated laser beam, it will be apparent that the present embodiment does not depend on the cross-sectional shape of the light emitting portions since the shape and magnitude of the laser beam is determined depending on the configuration of the opening in the p-type ohmic electrode 110, that is, the configuration of the multi-layered dielectric film mirror 111 formed in the opening. As shown in FIGS. 18a and 18b, if the opening 115 is of a circular cross-section, a finely circular laser beam can be obtained. The diameter of the laser beam shown in FIG. 18a is larger than that of the laser beam shown in FIG.

Figure 18C:
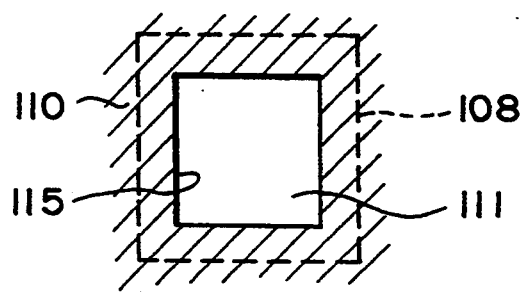
Figure 18D:
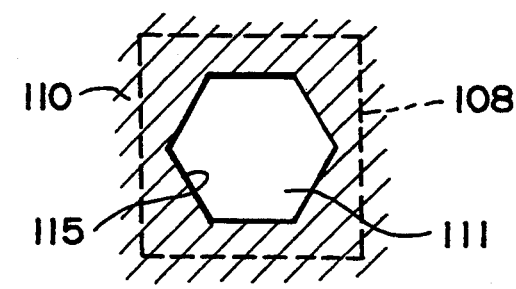

18b. In other words, a laser beam having its desired cross-sectional shape and diameter may be provided simply by changing the cross-sectional shape and area of the opening 115. As will be apparent from FIGS. 18c and 18d, a near circular beam may be obtained even if the opening 115 is of a regular polygon.

Next, the cross-sectional configuration of the column-like portion in the surface emission type semiconductor laser constructed in accordance with this embodiment will be considered below.

As shown in Table 2, it will be apparent therefrom that if the diameter is equal to or less than 10 μm, the generation was carried out in the basic mode. If the diameter is larger than 10 μm, the generation was made in first-order or more mode. If the cross-section of the column-like portion is regularly polygonal, the length of a diagonal line corresponding to each of the diameters shown in Table 2 provides the same result.

Although the aforementioned embodiment refers to a rib waveguide type refraction waveguide structure, that embodiment is also applicable to a semiconductor laser device of buried type refraction waveguide structure mentioned in the second embodiment.

Seventh Embodiment

Referring to a semiconducter laser in this embodiment, which is the same type as the third embodiment (FIG. 6), the exit-side multi-layered dielectric film mirror 311 includes the geometric center of each contact layer 808 in plurarity of the light emitting portions, and is formed within the opening formed in an area ranged between 10% and 90% of the surface area of the contact layer 308.

Figure 19A:
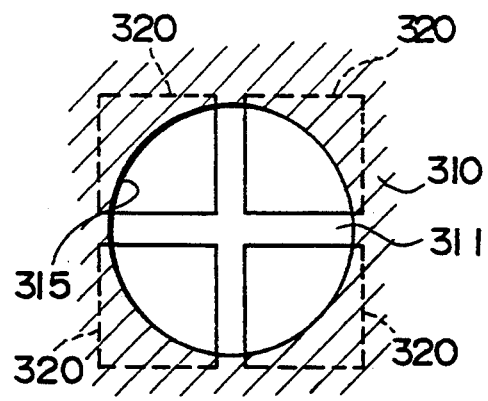
FIGS. 19a–19d schematically illustrate the different shapes of opening in the light exit side electrode of a semiconductor laser constructed according to the seventh embodiment of the present invention.
Figure 19B:
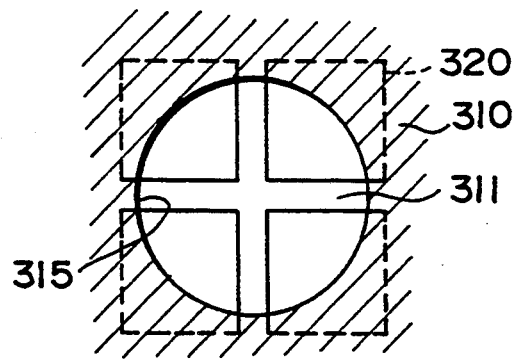
Figure 19C:
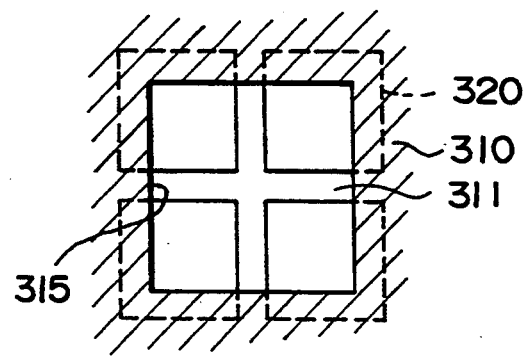
Figure 19D:
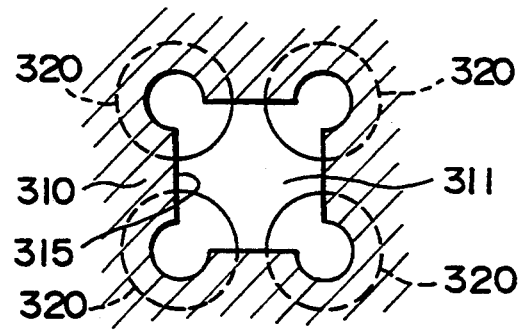

There will now be described the configuration of the opening formed over the light emitting portions and the buried layer 309 therebetween. FIGS. 19a–19d exemplify various configurations which can be taken in an opening 315 formed at a position opposed to four light emitting portions 320 and a buried layer 309 therebetween. FIGS. 19a and 19b show circular openings 315, the opening shown in FIG. 19a providing a laser beam having a circular cross-section with its diameter larger than that of the laser beam shown in FIG. 19b. FIG. 19c shows a square opening 315 which can provide a laser beam having its near circular cross-section. The magnitude of the square opening 315 may be changed to generate a laser beam having a desired diameter in cross-section. The opening S15 may be formed into any polygonal cross-sectional configuration other than the square. FIG. 19d exemplifies an opening 315 formed over the four light emitting portions 320 of circular cross-section and the buried layer 309 therebetween. In any event, the opening 315 is formed at a position including the geometric center of the corresponding one of the four light emitting portions 320 and ranging between 10% and 90% of the surface area of the exit-side end face of the respective light emitting portions 320.

The number and arrangement of the light emitting portions 320 may be suitably selected to be other than those of the aforementioned embodiments. For example, a plurality of light emitting portions S20 may be equidistantly arranged in row and/or column and an opening 315 may be formed at a position opposite to the respective one of the light emitting portions 320 and the adjacent buried layer 309. In such a manner, a line beam can be obtained.

Even if a laser beam is to be generated from a plurality of column-like portions in the above manner, any desired light spot may be provided simply by changing the configuration and cross-sectional area of the openings in the respective exit-side electrodes. This is very advantageous in that the configuration and magnitude of the light spot can be varied without any change in the cross-sectional shape and spacing of the column-like portions.

If a plurality of optical resonators each consisting of plural column-like semiconductor layers are formed on the semiconductor substrate with one of the exit-side electrodes each having a single opening being independently formed for each resonator, a plurality of laser beams each having an increased light spot may be independently controlled with respect to ON, OFF and modulation.

It is to be understood that the surface emission type semiconductor laser of the present invention may be equivalently applied to any desirable light source in various devices such as printer, copying machine, facsimile, display and so on.

Figure 20:
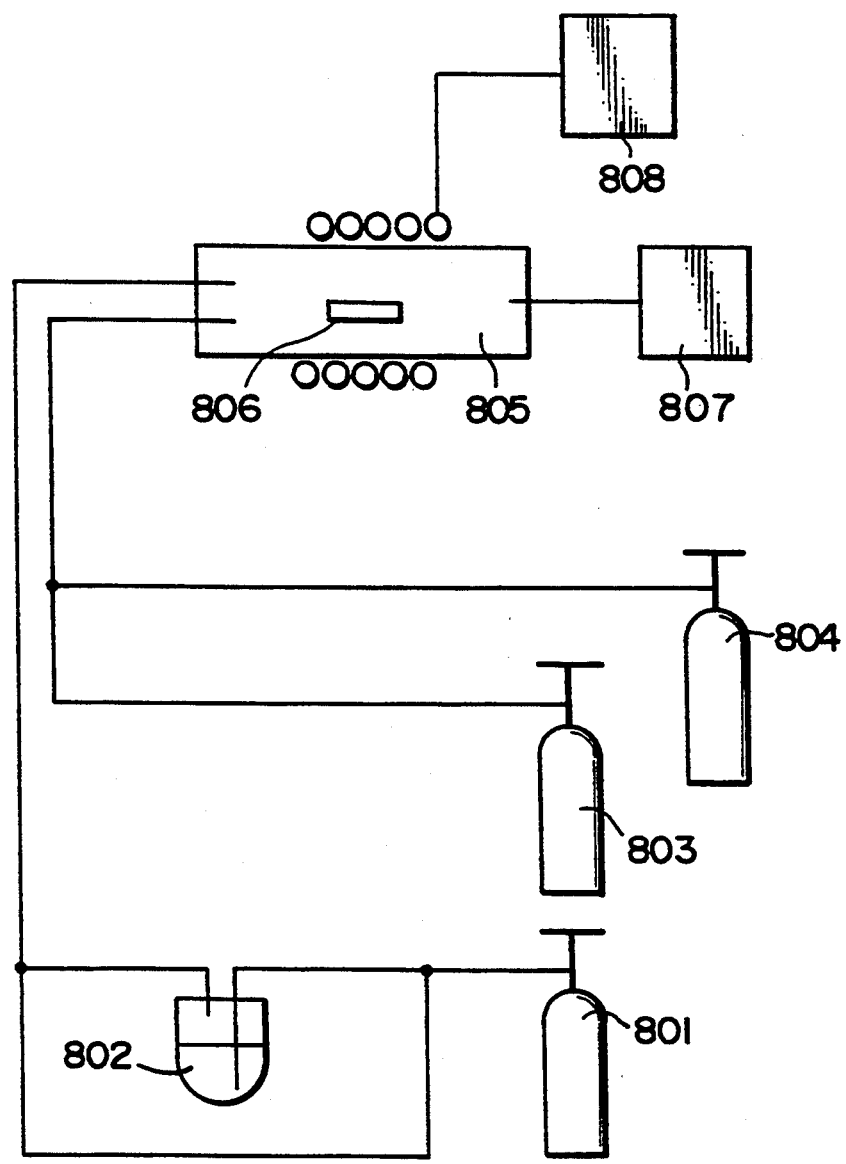
FIG. 20 is a schematic view of an apparatus for producing the II–VI group compound semiconductor layers in the semiconductor lasers constructed according to the respective embodiments of the present invention. Separate Sheet C.
Figure 21:
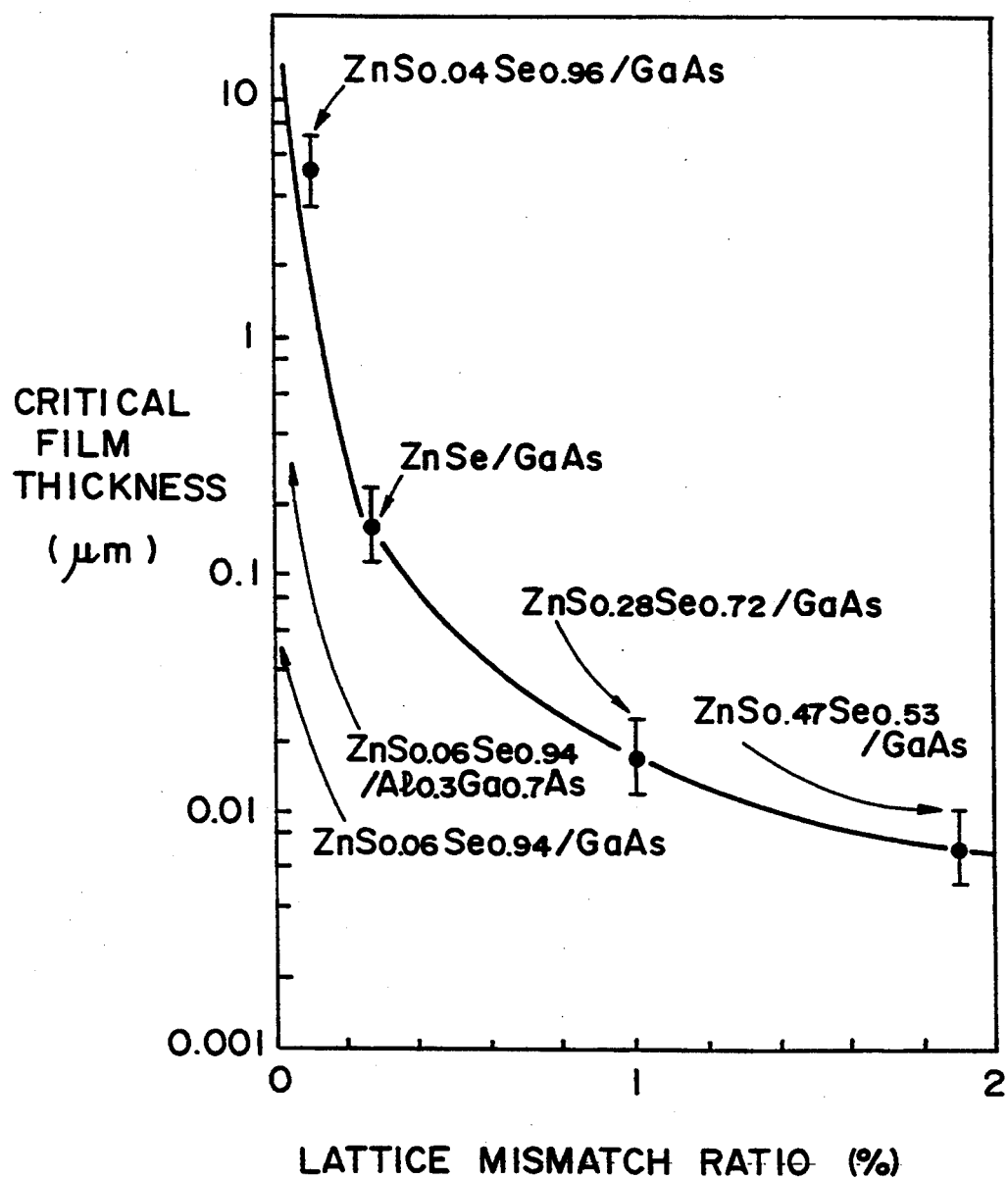
FIG. 21 is a graph showing the relationship between lattice mismatch ratios of substrates and crystal layers on the respective substrates and critical film-thicknesses.
Figure 22:
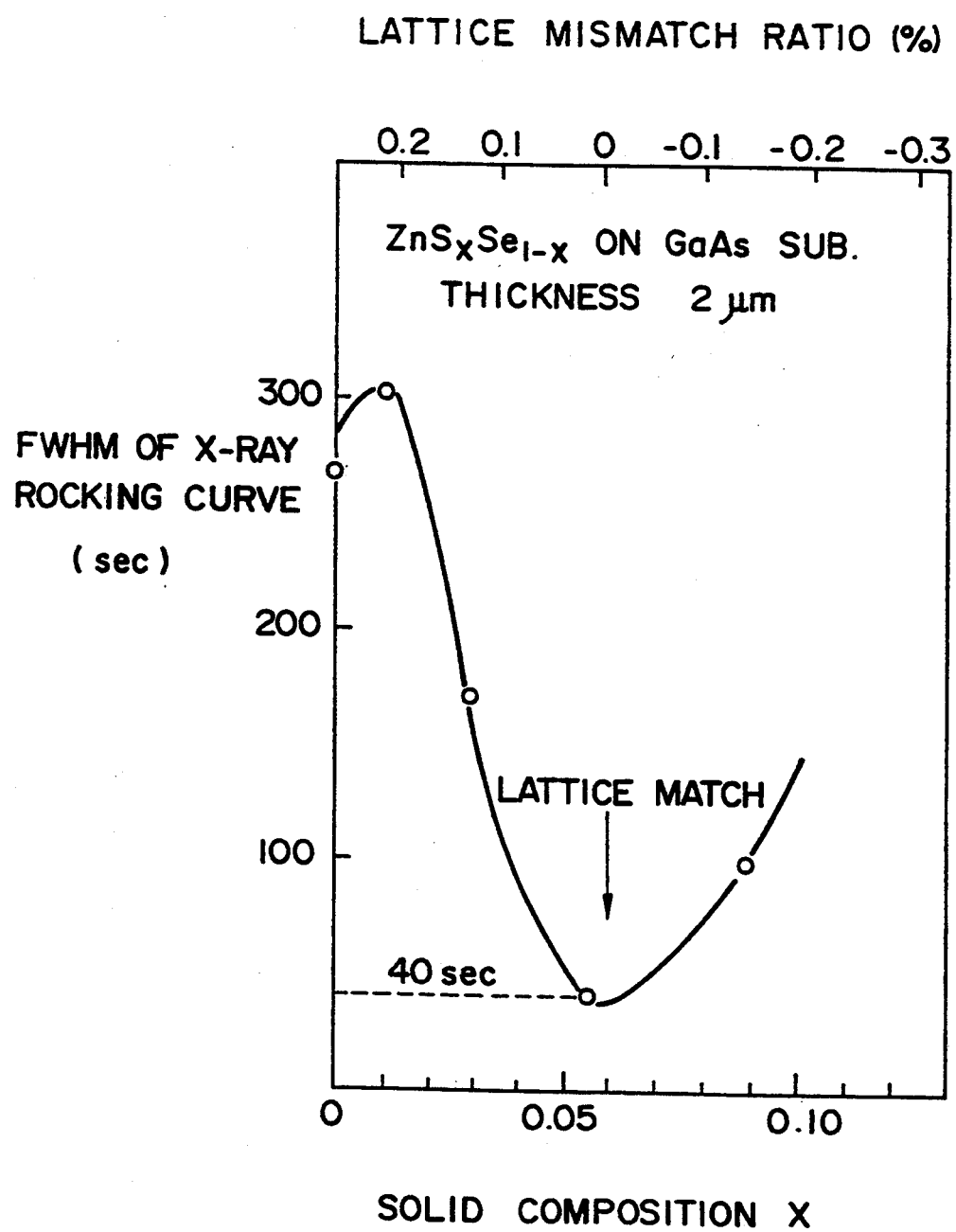
FIG. 22 is a graph showing the relationship between the percentage compositions x of $ZnS_xSe_{1-x}$ layers formed on GaAs substrates and the FWHM of X-ray rocking curve.

FIG. 20 schematically shows the arrangement of an apparatus for producing the II–VI group compound semiconductor layers constructed according to the respective embodiments of the present invention.

Referring to FIG. 20, II group material is supplied by bubbling a cylinder 802 containing DMZn-DMSe adduct with hydrogen from a hydrogen cylinder 801. On the other hand, VI group material is supplied from an $H_2Se$ cylinder 808 containing 10% $H_2Se$ diluted by hydrogen and an $H_2S$ cylinder 804 containing 10% $H_2S$ diluted by hydrogen. The materials are supplied to a reaction pipe 805 wherein a ZnSSe layer grows on a substrate placed on a carbon susceptor 806 which is heated by a high-frequency oscillator 808. The pressure in the reaction pipe 805 can be regulated by adjusting the exhaust from an exhausting system 807.

This apparatus is characterized by that the ZnSSE layer can be uniformly grown at lower temperatures over an increased extent with improved crystallinity.

Although the embodiments of the present invention have been described as to the formation of the II–VI group compound semiconductor layer from $ZnS_{0.06}Se_{0.94}$, the II–VI group compound semiconductor layer may be formed of ZnSe, ZnS, ZnCdS, CdSSe and superlattice compound such as ZnS-ZnSe. However, it is preferable that the lattice parameter of the buried layer is consistent with that of the substrate. Adducts and hydrides which are desirably used to form the II–VI group compound semiconductor layer are shown in Table 4.

TABLE 4

| Buried Layer | Organometallic Adduct | Hydride |
| --- | --- | --- |
| ZnSe | Dimethyl Zinc-Dimethyl Selenium | $H_2Se$ |
| ZnS | Dimethyl Zinc-Dimethyl Selenium | $H_2S$ |
| ZnCdS | Dimethyl Zinc-Dimethyl Selenium Dimethyl Cadmium-Dimethyl Selenium | $H_2S$ |
| CdSSe | Dimethyl Cadmium-Dimethyl Selenium | $H_2S$ $H_2Se$ |
| ZnS | Dimethyl Zinc-Diethyl sulfide | $H_2S$ |
| ZnTe | Dimethyl Zinc-Diethyl sulfide | $H_2Te$ |
| CdTe | Dimethyl Cadmium-Dimethyl Selenium | $H_2Te$ |

We claim:

1. A surface emission type semiconductor laser for emitting a beam in a direction perpendicular to a semiconductor substrate, comprising:
   an optical resonator including a pair of reflecting mirrors having different reflectivities and a plurality of semiconductor layers between said reflecting mirrors, said semiconductor layers including at least a cladding layer in said semiconductor layers being formed into at least one column-like portion;

a II–VI group compound semiconductor epitaxial layer surrounding said at least one column-like portion;

and a ratio of the difference between a lattice constant (A) of said column-like portion and a lattice constant (B) of said II–VI group compound semiconductor epitaxial layer with respect to the lattice constant (A) of said column-like portion (hereinafter, this ratio $|B-A|/A$ will be referred to "lattice mismatch ratio") being equal to or less than 0.2%.

2. A surface emission type semiconductor laser as defined in claim 1 wherein said ratio ($|B-A|/A$) is equal to or lower than 0.16%.

3. A surface emission type semiconductor laser as defined in claim 1 wherein said II–VI group compound semiconductor epitaxial layer is formed of an adduct consisting of a II group organometallic compound and a VI group organometallic compound and a VI group hydride by means of metalorganic chemical vapor deposition.

4. A surface emission type semiconductor laser as defined in claim 1 wherein said II–VI group compound semiconductor epitaxial layer has its thickness ranging between 0.2 $\mu$m and 5 $\mu$m.

5. A surface emission type semiconductor laser as defined in claim 3, wherein said adduct is formed of at least one selected from the group consisting of alkyl zinc-alkyl selenium, alkyl zinc-alkyl sulfide, alkyl cadmium-alkyl selenium and alkyl cadmium-alkyl sulfide and wherein the hydride is formed of at least one selected from the group consisting of hydrogen selenide, hydrogen sulfide and hydrogen telluride.

6. A surface emission type semiconductor laser as defined in claim 3, wherein said II–VI group compound semiconductor epitaxial layer includes a combination of said adduct with said VI group hydride selected from dimethyl zinc-dimethyl selenium, hydrogen selenide and hydrogen sulfide; dimethyl zinc-dimethyl selenium and hydrogen selenide; dimethyl zinc-dimethyl selenium, dimethyl cadmium-dimethyl selenium and hydrogen sulfide; and dimethyl cadmium-dimethyl selenium, hydrogen sulfide and hydrogen selenide; dimethyl zinc-diethyl sulfide and hydrogen sulfide; dimethyl zinc-diethyl sulfide and hydrogen telluride; diethyl cadmium-diethyl selenium and hydrogen telluride.

7. A surface emission type semiconductor laser as defined in claim 1 wherein a combination of materials forming said column-like portion and said II–VI group compound semiconductor epitaxial layer is at least one selected from a group consisting of combinations; $Al_{x-}Ga_{1-x}As$ (x:0–1)-$ZnS_ySe_{1-y}$ (y:0.02–0.08), $In_xGa_{1-x}P$ (x:0.5)-$ZnS_ySe_{1-y}$ (y:0 through 0.07) and $GaAs_xP_{1-x}$ (x:0.5)-$ZnS_ySe_{1-y}$ (y:0.41–0.49).

8. A surface emission type semiconductor laser as defined in claim 1, wherein the cross-section of said at least one column-like portion parallel to said semiconductor substrate is of a circular or regularly polygonal configuration.

9. A surface emission type semiconductor laser as defined in claim 1, wherein said at least one column-like portion has either a diameter or diagonal line equal to or less than 10 $\mu$m in planes parallel to said semiconductor substrate.

10. A surface emission type semiconductor laser as defined in claim 1, wherein a semiconductor contact layer of said optical resonator on an exit side thereof has a thickness equal to or less than 3.0 $\mu$m.

11. A surface emission type semiconductor laser as defined in claim 1, wherein said optical resonator includes one column-like portion and wherein one of said reflecting mirrors on an exit side is formed opposite to an end face of said column-like portion within a range of said end face.

12. A surface emission type semiconductor laser as defined in claim 11, wherein said column-like portion does not include any active layer and wherein said column-like portion defines a rib waveguide type refraction waveguide structure.

13. A surface emission type semiconductor laser as defined in claim 11, wherein said column-like portion includes an active layer and wherein said column-like portion defines a buried type refraction waveguide structure.

14. A surface emission type semiconductor laser as defined in claim 1, wherein said optical resonator includes separation groove means for separating a plurality of said column-like portions from one another, said II–VI group compound semiconductor epitaxial layer being located in said separation groove means to form a light emitting portion on each of said column-like portions, and wherein said separation groove means does not reach an active layer in said optical resonator, whereby light beams from said light emitting portions can be synchronized with one another in phase.

15. A surface emission type semiconductor laser as defined in claim 14, wherein said separation groove means has side walls extending perpendicular to said semiconductor substrate.

16. A surface emission type semiconductor laser as defined in claim 14, wherein said II–VI group compound epitaxial layer is transparent for the wavelength of the emitted laser beam and wherein the reflecting mirror on an exit side is formed over a region opposite to end faces of said column-like portions and to said II–VI group compound epitaxial layer located in said separation groove means.

17. A surface emission type semiconductor laser as defined in claim 16, wherein said II–VI group compound semiconductor epitaxial layer is formed of any one selected from a group consisting of ZnSe, ZnS, ZnSSe, ZnCdS, CdSSe, ZnTe and CdTe.

18. A surface emission type semiconductor laser as defined in claim 16, wherein a width or said separation groove means in a direction parallel to said semiconductor substrate is equal to or more than 0.5 $\mu$m and less than 10 $\mu$m.

19. A surface emission type semiconductor laser as defined in claim 16, wherein each of said column-like portions has a circular or regularly polygonal cross-section in a two-dimensional plane parallel to said semiconductor substrate and wherein said plurality of column-like portions are arranged in line symmetry in said two-dimensional plane to emit a laser beam having a circular cross-section.

20. A surface emission type semiconductor laser as defined in claim 16, wherein each of said column-like portions has a non-circular or non-polygonal cross-section on a two-dimensional plane parallel to said semiconductor substrate and wherein outer edges of said column-like portions are arranged to form substantially a circular or regularly polygonal profile, whereby a laser beam having a circular cross-section can be emitted from the semiconductor laser.

21. A surface emission type semiconductor laser as defined in claim 16, wherein a plurality of said optical resonators each defined by a plurality of said column-like portions are formed on said semiconductor substrate to provide an independent electrode in each of said optical resonators on an exit side, whereby a laser beam emitted from each of said optical resonator means and having a circular cross-section capable of forming an increased light emitting spot can be independently controlled in ON, OFF and modulation.

22. A surface emission type semiconductor laser as defined in claim 16, wherein said plurality of column-like portions are equidistantly arranged in row and/or column to provide a laser beam emitted therefrom in the form of a line beam.

23. A surface emission type semiconductor laser as defined in claim 1, wherein an active layer of multi-quantum well structure is formed at the lower layer section of said cladding layer having the column-like portion, said active layer including a plurality of well layers each of which is sandwiched between barrier layers.

24. A surface emission type semiconductor laser as defined in claim 23, further comprising a waveguide layer formed at the lower layer section of said active layer of multi-quantum well structure, said waveguide layer adapted to propagate light rays in a direction parallel to said active layer.

25. A surface emission type semiconductor laser as defined in claim 24, wherein the refractive index of said waveguide layer is lower than the equivalent refractive index of said active layer but higher than the refractive index of the cladding layer below said waveguide layer.

26. A surface emission type semiconductor laser as defined in claim 25, wherein said optical resonator includes one column-like portion and wherein one of said reflecting mirrors on the exit side is formed opposite to the end face of said column-like portion within the range of said end face.

27. A surface emission type semiconductor laser as defined in claim 26, wherein said optical resonator has a rib waveguide type refractive index waveguide structure, said rib waveguide being formed by said active layer of multi-quantum well structure.

28. A surface emission type semiconductor laser as defined in claim 26, wherein said column-like portion includes said active layer of multi-quantum well structure to form a buried type refractive index waveguide structure.

29. A surface emission type semiconductor laser as defined in claim 23, wherein said optical resonator includes separation groove means for separating a plurality of said column-like portions from one another, said II–VI group compound semiconductor epitaxial layer being located in said separation groove means to form a light emitting portion on each of said column-like portions, and wherein said active layer is formed as a common layer for all the light emitting portions, whereby light beams from said light emitting portions can be synchronized with one another in phase.

30. A surface emission type semiconductor laser as defined in claim 29, further comprising a waveguide layer formed at the lower layer section of said active layer of multi-quantum well structure, said waveguide layer adapted to propagate light rays in a direction parallel to said active layer.

31. A surface emission type semiconductor laser as defined in claim 30, wherein the refractive index of said waveguide layer is lower than the equivalent refractive index of said active layer but higher than the refractive index of the cladding layer below said waveguide layer.

32. A surface emission type semiconductor laser as defined in claim 1, wherein the semiconductor layers include at least a contact layer and said cladding layer in said semiconductor layers being formed into at least one column-like portion and an exit-side electrode formed in contact with a part of said contact layer, said exit side electrode having an opening formed therein at a position including a geometric center of said contact layer and ranging between 10% and 90% of a surface area of said contact layer, said opening being formed to receive an exit-side reflecting mirror in said pair of reflecting mirrors.

33. A surface emission type semiconductor laser as defined in claim 32, wherein a cross-sectional shape of said opening in a direction parallel to said semiconductor substrate is either circular or regularly polygonal.

34. A surface emission type semiconductor laser as defined in claim 38, wherein the cross-sectional shape of said at least one column-like portion in a direction parallel to said semiconductor substrate is either circular or regularly polygonal and wherein a diameter or diagonal length thereof is equal to or less than 10 $\mu$m.

35. A surface emission type semiconductor laser as defined in claim 32, wherein said optical resonator includes one of said column-like portion and wherein said exit-side electrode has one opening formed therein at a position opposite to an end face of said column-like portion.

36. A surface emission type semiconductor laser as defined in claim 35, wherein said column-like portion does not include any active layer and wherein said column-like portion defines a rib waveguide type refraction waveguide structure.

37. A surface emission type semiconductor laser as defined in claim 35, wherein said column-like portion includes an active layer and wherein said column-like portion defines a buried type refraction waveguide structure.

38. A surface emission type semiconductor laser as defined in claim 32, wherein said optical resonator includes separation groove means for separating a plurality of said column-like portions from one another, said II–VI group compound semiconductor epitaxial layer being located in said separation groove means to form a light emitting portion on each of said column-like portions, and wherein said separation groove means does not reach an active layer in said optical resonator, whereby light beams from said light emitting portions can be synchronized with one another in phase.

39. A surface emission type semiconductor laser as defined in claim 38, wherein a plurality of said exit-side electrodes are independently formed one for each column-like portion, each of said exit-side electrodes having one opening formed therein at a position opposite to a corresponding end face of said column-like portions.

40. A surface emission type semiconductor laser as defined in claim 39, wherein a cross-sectional shape of each said openings in a direction parallel to said semiconductor substrate is either circular or regularly polygonal.

41. A surface emission type semiconductor laser as defined in claim 40, wherein the cross-sectional shape of said column-like portions in a direction parallel to said semiconductor substrate is either circular or regularly polygonal and wherein a diameter or diagonal length thereof is equal to or less than 10 μm.

42. A surface emission type semiconductor laser as defined in claim 38, wherein said II–VI group compound semiconductor epitaxial layer is transparent for the wavelength of the emitted laser beam and wherein the exit-side electrode includes an opening formed therein at a position opposite to the end faces of said column-like portion and to said II–VI group compound semiconductor epitaxial layer located in said separation groove means.

43. A surface emission type semiconductor laser as defined in claim 42, wherein a plurality of said optical resonators each consisting of a plurality of said column-like portions are formed on said semiconductor substrate and wherein a plurality of said exit-side electrodes each having said opening formed therein are independently formed one for each optical resonator.

* * * * *